(12) United States Patent
Ukeda et al.

(10) Patent No.: US 8,436,355 B2
(45) Date of Patent: May 7, 2013

(54) THIN-FILM TRANSISTOR, MANUFACTURING METHOD THEREFOR, AND ELECTRONIC DEVICE USING A THIN-FILM TRANSISTOR

(75) Inventors: Takaaki Ukeda, Osaka (JP); Tohru Saitoh, Chiba (JP); Kazunori Komori, Hyogo (JP); Sadayoshi Hotta, Osaka (JP)

(73) Assignee: Panasonic Corporation, Osaka (JP)

(*) Notice: Subject to any disclaimer, the term of this patent is extended or adjusted under 35 U.S.C. 154(b) by 328 days.

(21) Appl. No.: 12/742,137

(22) PCT Filed: Nov. 14, 2008

(86) PCT No.: PCT/JP2008/003330
§ 371 (c)(1),
(2), (4) Date: May 10, 2010

(87) PCT Pub. No.: WO2009/063648
PCT Pub. Date: May 22, 2009

(65) Prior Publication Data
US 2010/0320467 A1 Dec. 23, 2010

Related U.S. Application Data

(60) Provisional application No. 60/987,867, filed on Nov. 14, 2007.

(30) Foreign Application Priority Data

Nov. 22, 2007 (JP) .............................. 2007-302682
Nov. 22, 2007 (JP) .............................. 2007-302683

(51) Int. Cl.
*H01L 33/00* (2010.01)

(52) U.S. Cl.
USPC .............. 257/59; 257/E21.414; 257/E29.291; 257/57; 438/158

(58) Field of Classification Search .................... 257/59, 257/57, E21.414, E29.291, E33.053
See application file for complete search history.

(56) References Cited

U.S. PATENT DOCUMENTS

| 5,773,329 A | 6/1998 | Kuo |
| 6,097,037 A | 8/2000 | Joo et al. |

(Continued)

FOREIGN PATENT DOCUMENTS

| JP | 62-172761 | 7/1987 |
| JP | 3-44968 | 2/1991 |

(Continued)

OTHER PUBLICATIONS

International Search Report for PCT/JP2008/003330, mailed Feb. 17, 2009.

(Continued)

*Primary Examiner* — Mamadou Diallo
(74) *Attorney, Agent, or Firm* — Greenblum & Bernstein, P.L.C.

(57) ABSTRACT

Disclosed is a method that includes: forming a gate electrode on a substrate, then forming an insulation layer so as to completely cover the gate electrode, thereafter forming a semiconductor layer on the insulation layer, and then forming a crystallization-inducing metal layer on the semiconductor layer; removing the part of at least the crystallization-inducing metal layer that is over a channel region of the semiconductor layer; forming source and drain electrodes at a location which is over source and drain regions respectively located at opposite sides with respect to the channel region of the semiconductor layer and is above the crystallization-inducing metal layer; and heating the crystallization-inducing metal layer so as to form a silicide layer of a crystallization-inducing metal.

21 Claims, 12 Drawing Sheets

U.S. PATENT DOCUMENTS

| | | | |
|---|---|---|---|
| 7,648,861 B2* | 1/2010 | Yamazaki et al. | 438/149 |
| 2001/0044172 A1 | 11/2001 | Chen et al. | |
| 2002/0001048 A1* | 1/2002 | Lee et al. | 349/43 |
| 2002/0009835 A1 | 1/2002 | Chen et al. | |
| 2004/0197964 A1* | 10/2004 | Lee et al. | 438/149 |
| 2005/0041166 A1* | 2/2005 | Yamazaki et al. | 349/42 |
| 2006/0071211 A1 | 4/2006 | Lee | |
| 2007/0087490 A1* | 4/2007 | Seo et al. | 438/158 |
| 2010/0194719 A1 | 8/2010 | Saitoh et al. | |

FOREIGN PATENT DOCUMENTS

| | | |
|---|---|---|
| JP | 09-092840 | 4/1997 |
| JP | 10-70077 | 3/1998 |
| JP | 2001-332744 | 11/2001 |
| JP | 2002-124683 | 4/2002 |
| JP | 2002-151695 | 5/2002 |
| JP | 2006-108623 | 4/2006 |

OTHER PUBLICATIONS

Japanese Office Action in counterpart application No. 2009-541053, dated Jan. 29, 2013.

* cited by examiner

Crystallization direction

Crystallization direction

THIN-FILM TRANSISTOR, MANUFACTURING METHOD THEREFOR, AND ELECTRONIC DEVICE USING A THIN-FILM TRANSISTOR

CROSS-REFERENCE TO RELATED APPLICATIONS

This application claims the benefit of U.S. Provisional Application No. 60/987,867, filed Nov. 14, 2007. This application also claims the benefit of International Application No. PCT/JP2008/003330, filed Nov. 14, 2008.

TECHNICAL FIELD

The present invention relates to a thin-film transistor, a manufacturing method therefor, and an electronic device using a thin-film transistor.

BACKGROUND ART

For example, in electronic devices (for example, television receivers) using an organic electroluminescence display device or a liquid crystal display device, the display elements that are arranged in a matrix configuring the organic electroluminescence display device or the liquid crystal display device are driven by thin-film transistors.

Subsequently, the following structure is adopted as a structure for the above-mentioned thin film transistor.

Specifically, a structure is adopted which includes a substrate, a gate electrode provided on the substrate, an insulation layer covering the gate electrode, a semiconductor layer provided on the insulation layer, and a source and drain electrodes provided on source and drain regions at respectively opposite sides with respect to a channel region of the semiconductor layer (a similar technique is disclosed in Patent Reference 1 below).

Patent Reference 1: Japanese Unexamined Patent Application Publication No. 2006-108623

DISCLOSURE OF INVENTION

Problems that Invention is to Solve

A problem of the conventional thin-film transistor is low productivity.

Specifically, in the conventional thin-film transistor, in order to promote the crystallization of the semiconductor layer, the gate electrode, the insulation layer, and the semiconductor layer are provided on the substrate in such order, after which a crystallization-inducing metal layer is provided on the source and drain regions at both sides of the channel region of the semiconductor layer, and then heating is performed next.

Subsequently, with this heating, the crystallization of the semiconductor layer is promoted by the crystallization-inducing metal layer, after which the crystallization-inducing metal layer is removed. Next, the source and drain electrodes are formed on the source and drain regions at respectively opposite sides with respect to the channel region of the semiconductor layer.

Specifically, in the conventional thin-film transistor, the crystallization-inducing metal layer provided for promoting the crystallization of the semiconductor layer is removed prior to the formation of the source and drain electrodes, and thus productivity is reduced by the need for such removal process.

Consequently, the present invention is conceived with the object of improving productivity.

Means to Solve the Problems

In order to achieve the aforementioned object, the method of manufacturing a thin-film transistor according to the present invention is a method of manufacturing a thin-film transistor, the method including: forming a gate electrode on a substrate, forming an insulation layer so as to cover the gate electrode, forming a semiconductor layer on the insulation layer, and forming a crystallization-inducing metal layer on the semiconductor layer; removing at least a part of the crystallization-inducing metal layer, the part being over a channel region of the semiconductor layer; forming source and drain electrodes at positions on the crystallization-inducing metal layer which are over source and drain regions respectively, the source and drain regions being located at respectively opposite sides with respect to the channel region of the semiconductor layer; and heating the crystallization-inducing metal layer to form a silicide layer of a crystallization-inducing metal.

More specifically, in a first method of manufacturing a thin-film transistor according to the present invention, the forming of source and drain electrodes includes forming an electrode layer on the crystallization-inducing metal layer, before the removal in the removing, in the removing, a part of the electrode layer, a part of the crystallization-inducing metal layer, and a part of the semiconductor layer are removed, the part of the electrode layer and the part of the crystallization-inducing metal layer being located over the channel region of the semiconductor layer, and the part of the semiconductor layer being located in the channel region, the source and drain electrodes are formed as a result of the removal in the removing, and in the heating, the crystallization-inducing metal layer is heated after the source and drain electrodes are formed in the forming of source and drain electrodes.

Furthermore, in a second method of manufacturing a thin-film transistor according to the present invention, in the heating, the source and drain regions of the semiconductor layer are changed into a crystal layer and the silicide layer of the crystallization-inducing metal is formed on the crystal layer, by heating the semiconductor layer and the crystallization-inducing metal layer after the removal in the removing, and in the forming of source and drain electrodes, a non-crystal layer of the semiconductor layer is further formed on the silicide layer of the crystallization-inducing metal after the heating in the heating, and the source and drain electrodes are formed after an electrode layer is formed on the non-crystal layer of the semiconductor layer, the non-crystal layer containing an n-type or p-type impurity.

Furthermore, a first thin-film transistor according to the present invention includes: a substrate; a gate electrode formed on the substrate; an insulation layer covering the gate electrode; a semiconductor layer formed on the insulation layer; and source and drain electrodes (when one is a source electrode, the other is a drain electrode, and the same interpretation shall be maintained hereafter in this Description) respectively formed over source and drain regions (when one is a source region, the other is a drain region, and the same interpretation shall be maintained hereafter in this Description) which are located at respectively opposite sides with respect to a channel region of the semiconductor layer, wherein a silicide layer of a crystallization-inducing metal is formed between the source and drain regions of the semiconductor layer and the source and drain electrodes which are formed above the source and drain regions. With this, the desired object is achieved.

Furthermore, a second thin-film transistor according to the present invention includes: a substrate; a gate electrode formed on the substrate; an insulation layer covering the gate electrode; a semiconductor layer formed on the insulation layer; and source and drain electrodes (when one is a source electrode, the other is a drain electrode, and the same interpretation shall be maintained hereafter in this Description) respectively formed over source and drain regions (when one is a source region, the other is a drain region, and the same interpretation shall be maintained hereafter in this Description) which are located at respectively opposite sides with respect to a channel region of the semiconductor layer, wherein the source and drain regions of the semiconductor layer include a crystal layer at a substrate-side, a silicide layer of a crystallization-inducing metal formed on the crystal layer, and a non-crystal layer formed on the silicide layer, the non-crystal layer contains an n-type or p-type impurity, and the source and drain electrodes are formed on the non-crystal layer. With this, the desired object is achieved.

Effects of the Invention

As previously described, the first thin-film transistor according to the present invention includes a substrate; a gate electrode formed on the substrate; an insulation layer covering the gate electrode; a semiconductor layer formed on the insulation layer; and source and drain electrodes respectively formed over source and drain regions which are located at respectively opposite sides with respect to a channel region of the semiconductor layer, wherein a silicide layer of a crystallization-inducing metal is formed between the source and drain regions of the semiconductor layer and the source and drain electrodes which are formed above the source and drain regions.

Specifically, in the first method of manufacturing a thin-film transistor according to the present invention, the crystallization-inducing metal layer is formed on the semiconductor layer, then the electrode layer is formed above the crystallization-inducing metal layer, then the source and drain electrodes are formed each on one side of a channel region of the semiconductor layer by removing a part of the electrode layer, the crystallization-inducing metal layer, and the semiconductor layer which are located in the channel region of the semiconductor layer, and then through the heating thereof, the silicide layer of a crystallization-inducing metal is formed between the source and drain regions of the semiconductor layer and the source and drain electrodes above the source and drain regions. Therefore, since the process for removing the crystallization-inducing metal layer is unnecessary, the first method of manufacturing a thin-film transistor according to the present invention has high productivity.

Since the silicide layer of a crystallization-inducing metal is present in between the source and drain regions of the semiconductor substrate and the source and drain electrodes provided above the source and drain regions, the resistance value in such part can be reduced and, with this, thin-film transistor efficiency can also be improved.

Specifically, since metal atoms are included in the silicide layer of a crystallization-inducing metal, carriers increase due to the free electrons of the metal atoms and, as a result, the resistance value becomes smaller and thus thin-film transistor efficiency can be improved.

Furthermore, the second thin-film transistor according to the present invention includes: a substrate; a gate electrode formed on the substrate; an insulation layer covering the gate electrode; a semiconductor layer formed on the insulation layer; and source and drain electrodes (when one is a source electrode, the other is a drain electrode, and the same interpretation shall be maintained hereafter in this Description) respectively formed over source and drain regions (when one is a source region, the other is a drain region, and the same interpretation shall be maintained hereafter in this Description) which are located at respectively opposite sides with respect to a channel region of the semiconductor layer, wherein the source and drain regions of the semiconductor layer include a crystal layer at a substrate-side, a silicide layer of a crystallization-inducing metal formed on the crystal layer, and a non-crystal layer formed on the silicide layer and containing an n-type or p-type impurity, and the source and drain electrodes are formed on the non-crystal layer. Accordingly, transistor characteristics are stabilized.

Specifically, according to the second thin-film transistor and the manufacturing method thereof in the present embodiment, the source and drain regions of the semiconductor layer are configured from a crystal layer on the substrate-side, a silicide layer of a crystallization-inducing metal provided on the crystal layer, and a non-crystal layer provided on the silicide layer, and thus stable crystallization can take place in the source and drain regions and the channel region of the semiconductor layer due to the crystallization-inducing metal layer.

Furthermore, since the non-crystal layer including an n-type or p-type impurity is formed above the silicide layer, the n-type or p-type impurity of the non-crystal layer does not inadvertently intrude into the crystal layer-side of the semiconductor layer, and as a result, transistor characteristics are stabilized.

In addition, since the silicide layer of a crystallization-inducing metal is present in between the crystal layer of the source and drain regions of the semiconductor substrate and the non-crystal layer provided above the crystal layer, the resistance value in such part can be reduced and, with this, thin-film transistor efficiency can also be improved.

Specifically, since metal atoms are included in the silicide layer of a crystallization-inducing metal, carriers increase due to the free electrons of the metal atoms and, as a result, the resistance value becomes smaller and thus thin-film transistor efficiency can be improved.

NUMERICAL REFERENCES

Figure 1:
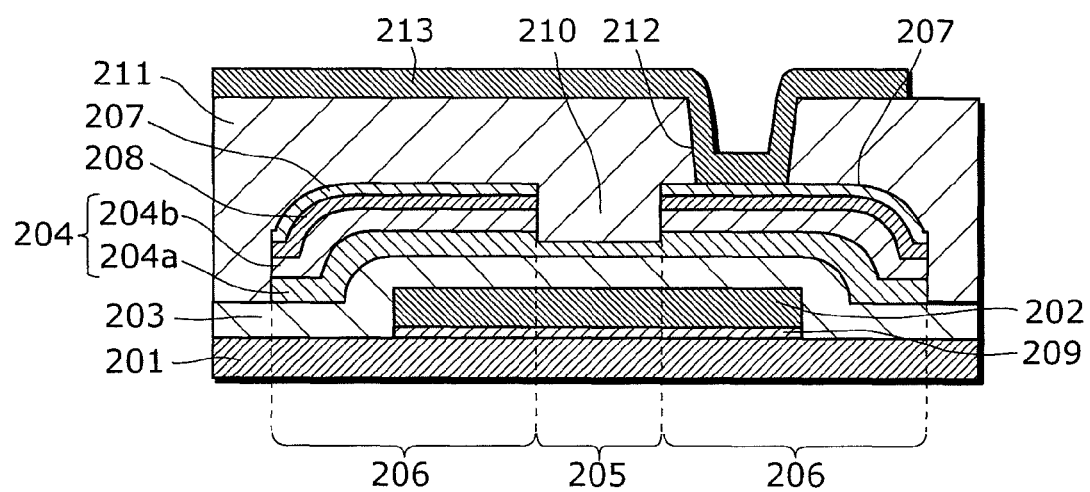
FIG. 1 is a cross-sectional view of a thin-film transistor in a first embodiment of the present invention.

201 Substrate
202 Gate electrode
203 Insulation layer
204 Semiconductor layer
204a First semiconductor layer
204b Second semiconductor layer
205 Channel region
206 Source and drain regions
207 Source and drain electrodes
207a Mo layer
208 Silicide layer
208a Ni layer
209 Silicon oxide layer
210 Recessed part
211 Flattening layer
212 Through-hole
213 Wire
214 Photoresist
215 Etching-protection layer
301 Substrate
302 Gate electrode
303 Insulation layer
304 Semiconductor layer
304a Crystal layer
304b Silicide layer
304c Non-crystal layer
305 Channel region
305a Removal region
306 Source and drain regions
307 Source and drain electrodes
308 Silicon oxide layer
309 Recessed part
310 Flattening layer
311 Through-hole
312 Wire
313 Crystallization-inducing metal layer
314 Etching-protection layer

BEST MODE FOR CARRYING OUT THE INVENTION

Hereinafter, an embodiment of the present invention shall be described with reference to the Drawings.

First Embodiment

FIG. 1 shows a thin-film transistor in a first embodiment of the present invention. The thin-film transistor includes a substrate 201, a gate electrode 202 provided on the substrate 201, an insulation layer 203 covering the gate electrode 202, a semiconductor layer 204 provided on the insulation layer 203, and source and drain electrodes 207 provided on source and drain regions 206 at respectively opposite sides with respect to a channel region 205 of the semiconductor substrate 204. A silicide layer 208 of a crystallization-inducing metal is provided in between the source and drain regions 206 of the semiconductor layer 204 and the source and drain electrodes 207 provided above of the source and drain regions 206.

Describing the structure of the thin-film transistor in further detail, first, the substrate 201 is made from glass for example, and a silicon oxide layer 209 is provided on the substrate 201. The gate electrode 202 is formed on the silicon oxide layer 209 by, for example, sputtering of Mo.

Furthermore, the semiconductor substrate 204 includes two layers, namely, a first semiconductor layer 204a on the lower surface-side and a second semiconductor layer 204b on an upper surface-side. Of the two, the first semiconductor layer 204a is made from crystallized non-doped amorphous silicon, and the second semiconductor layer 204b is made from crystallized n-type or p-type amorphous silicon.

Although described in detail in the manufacturing method to be described later, the silicide layer 208 of a crystallization-inducing metal is formed through the combining of a crystallization-inducing metal (which is at least one of Ni, Pd, Ti, Ag, Au, Al, Sn, Sb, Cu, Co, Cr, Mo, Tr, Ru, Rh, and Cd, although Ni is used as a representative in the present embodiment) and the silicon of the second semiconductor substrate 204b due to heating. It is to be noted that, as a crystallization-inducing metal, it is also possible to use at least one type of element selected from 8th group elements, 3B, 4B, and 5B elements.

Although the source and drain electrodes 207 are provided on the silicide layer 208 of a crystallization-inducing metal, the upper part of the first semiconductor layer 204a, the entire part of the second semiconductor layer 204b, the entire part of the silicide layer 208, and the entire part of the source and drain electrodes 207, which correspond to the channel region 205 of the semiconductor layer 204 are removed as shown in FIG. 1. With this, one of the source and drain electrodes 207 at the left and the right becomes a source electrode 207 and the other becomes a drain electrode 207.

Furthermore, with this removal, a recessed part 210 that reaches up to the upper part of the first semiconductor layer 204a is formed in the channel region 205 of the semiconductor layer 204. With the presence of this recessed part 210, the channel region 205 of the semiconductor layer 204 becomes a thinner layer compared to the source and drain regions 206.

Furthermore, a flattening layer 211 formed of a light-sensitive coating film is formed on the source and drain electrodes 207, and a part of a wire 213 is wired by passing through a through hole 212 in the flattening layer 211. With this, the source and drain electrodes 207 are connected to the wire 213.

Subsequently, the thin-film transistor in the present embodiment is connected to and drives, via the wire 231, the display elements arrayed in a matrix in the display device (an organic electroluminescence display device or a liquid crystal display device) of a television receiver for example.

Next, a method of manufacturing the thin-film transistor in the present embodiment shall be described.

First, the silicon oxide layer 209 and the gate electrode 202 are provided above the substrate 201 as shown in FIG. 2(a), and then patterning is performed by lithography, etching, and the like, as shown in FIG. 2(b).

Next, as shown in FIG. 2(c), the insulation layer 203, the first semiconductor layer 204a, and the second semiconductor layer 204b which includes an n-type or p-type impurity (P atoms or B atoms), are provided so as to cover the gate electrode 202.

Subsequently, as shown in FIG. 2(d), patterning of the first semiconductor layer 204a and the second semiconductor layer 204b is performed by lithography, etching, and the like.

Next, as shown in FIG. 2(e), a Ni layer 208a and a Mo layer 207a are provided on the second semiconductor layer 204b by sputtering, and a photoresist 214 having an opening in the channel region 205 is further provided.

Subsequently, as shown in FIG. 2(f), the opening of the photoresist 214 is utilized so as to remove the Ni layer 208a and Mo layer 207a corresponding to the channel region 205 by etching.

Next, as shown in FIG. 3(a), etching is further performed utilizing the opening of the photoresist 214 so that the entire part of the second semiconductor layer 204b and only the upper part of the first semiconductor layer 204a, which correspond to the channel region 205 are removed.

Specifically, in the present embodiment, the channel region 205 of the semiconductor layer 204 is formed by forming a recess in a portion of the semiconductor layer 204 that corresponds to the channel region 205 through etching. With this, the channel region 205 of the semiconductor layer 204 becomes a thinner layer compared to the source and drain regions 206 as shown in FIG. 3(a).

Next, the substrate 201 from which the photoresist 214 has been removed, as in the state in FIG. 3(a), is transported into an electric furnace.

In the electric furnace, the substrate 201 is gradually heated as it is transported, and the state in which the substrate 201 reaches 300° C. to 350° C. in the electric furnace at the start of the transportation is schematically shown in FIG. 3(b).

Specifically, in FIG. 3(b), a part of the n-type or p-type impurity (P-atoms or B-atoms) within the second semiconductor layer 204b diffuses into the first semiconductor layer 204a, and furthermore, as shown in FIG. 3(b), the Ni within the Ni layer 208a start diffusional movement to the first and second semiconductor layers 204a and 204b.

What is important here is that, as described above, the outer circumferences of the insulation layer 203, the first and second semiconductor layers 204a and 204b, the Ni layer 208a, and the Mo layer 207a are extended outside the outer circumference of the gate electrode 202.

Specifically, by extending the outer circumferences of the insulation layer 203, the first and second semiconductor layers 204a and 204b, the Ni layer 208a, and the Mo layer 207a outside the outer circumference of the gate electrode 202 in such manner, the outer circumference-parts of the first and second semiconductor layers 204a and 204b, the Ni layer 208a, and the Mo layer 207a outside the gate electrode 202 bend toward the substrate 201 as shown in FIG. 3(b). As a result, curved planes A (or slanted planes) which face the channel region 205 of the semiconductor layer 204 are formed in the outer circumference-parts of the first and second semiconductor layers 204a and 204b, the Ni layer 208a, and the Mo layer 207a extending outside the gate electrode 202.

It is to be noted that the "curved planes A (or slanted planes) which face the channel region 205 of the semiconductor layer 204 are formed", in the outer circumference-parts of the first and second semiconductor layers 204a and 204b, the Ni layer 208a, and the Mo layer 207a that extend outside the gate electrode 202, indicates a state in which the curved planes A (or slanted planes) face the channel region 205 of the semiconductor layer 204 in the case where the thin-film transistor in the present embodiment is cross-sectioned in the longitudinal direction as shown in FIG. 3(b).

Furthermore, the Mo layer 207a need not have such curved planes or slanted planes that face the channel region 205 of the semiconductor layer 204.

Although there are aspects that have yet to be fully analyzed at present, as a conclusion, the forming of such curved planes A significantly contributes to the crystallization of the channel region 205 because, in the outer circumference-parts of the first and second semiconductor layers 204a and 204b, trajectories (slanting arrow or horizontal arrow) leading to the channel region 205 of the semiconductor layer 204 are formed for the Ni moving to the first and second semiconductor layers 204a and 204b from the Ni layer 208a as shown in FIG. 3(b).

Specifically, in the silicon crystallization of the first and second semiconductor layers 204a and 204b, when heating reaches 500° C. or higher following the transportation of the substrate 201 within the electric furnace, the Ni acts as a catalyst for inducing crystallization, and thus crystallization progresses significantly.

The channel region 205 of the semiconductor layer 204 is far from the Ni layer 208 as can be seen from FIG. 3(b) and, in addition, is a thinner layer compared to the source and drain regions 206 as described previously, thus making it difficult for the Ni to reach. However, in the present embodiment, as a conclusion, Ni also reaches the channel region 205 as shown in the schematic diagram in FIG. 3(c), and thus crystallization is promoted, and characteristics can be sufficiently demonstrated (furthermore, it is considered that the P-atoms or B-atoms which are dopants within the second semiconductor layer 204b also move to the channel region 205 of the semiconductor layer 204 in the same manner as the Ni) although these are considered as being attributable to the forming of the curved planes A (or slanted planes), which face the channel region 205 of the semiconductor layer 204, in the outer circumference-parts of the first and second semiconductor layers 204a and 204b, the Ni layer 208a, and the Mo layer 207a that extend outside the gate electrode 202 as previously described.

Furthermore, as a result of performing heating at 500° C. or higher in FIG. 3(c), the Mo layer 207a becomes the source and drain electrodes 207 in FIG. 1 and the Ni layer 208a becomes the silicide layer 208 in FIG. 1.

In the substrate 201 configured in the above manner, the through-hole 212 can be easily formed next by providing the flattening layer 211 made from a light-sensitive resin on the source and drain electrodes 207, and performing exposure and developing through lithography as shown in FIG. 3(d).

Then, following FIG. 3(d), the wire 213 is formed by forming a wire layer (not illustrated) by sputtering, and performing patterning by lithography or etching, and thus arriving at the completed state in FIG. 1.

Subsequently, the thin-film transistor in the present embodiment is connected to and drives, via the wire 231, the display elements arrayed in a matrix in the display device (an organic electroluminescence display device or a liquid crystal display device) of a television receiver for example.

In this case, since the silicide layer 208 of a crystallization-inducing metal is present in between the source and drain regions 206 of the semiconductor substrate 204 and the source and drain electrodes 207 provided above the source and drain regions 206, the resistance value in such part can be reduced and, with this, thin-film transistor efficiency can also be improved.

Specifically, since metal atoms are included in the silicide layer 208 of a crystallization-inducing metal, carriers increase due to the free electrons of the metal atoms and, as a result, the resistance value becomes smaller and thus thin-film transistor efficiency can be improved.

Since a large number of the thin-film transistor in the present embodiment will be used, for example, in the display device of a television receiver, this also contributes significantly to the efficiency of the electronic device as a whole.

Furthermore, in the thin-film transistor in the present embodiment, the process for removing the Ni layer 208a used for promoting crystallization as described above becomes unnecessary, and thus the production process is simplified and productivity becomes high.

In addition, the Ni layer 208a that is left without being removed as described above combines with silicon thereby becoming the silicide layer 208 of a crystallization-inducing metal, and thus reducing the resistance in such part and also contributing significantly to improved efficiency.

Figure 4:
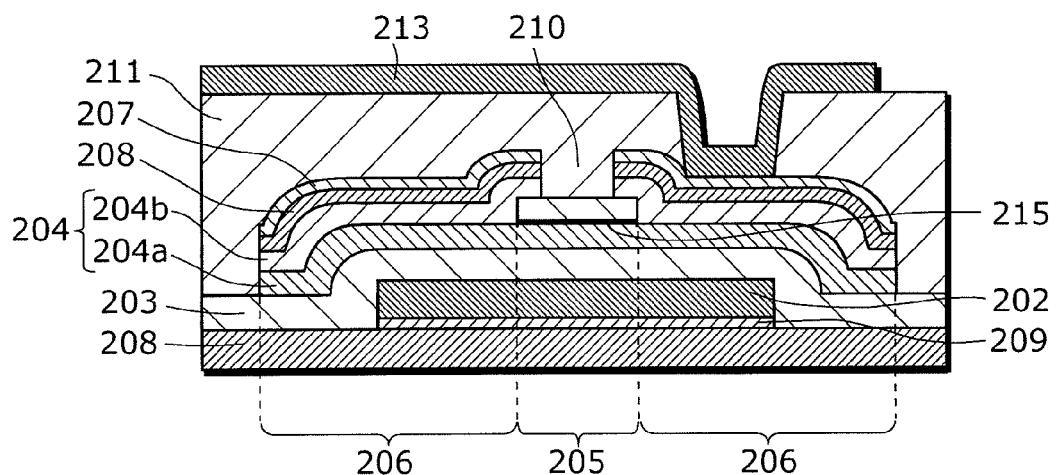
FIG. 4 is a cross-sectional view of a thin-film transistor in another embodiment (modification) of the present invention.

FIG. 4 shows another embodiment of the present invention, and the structure of a thin-film transistor thereof is as described below.

Figure 2:
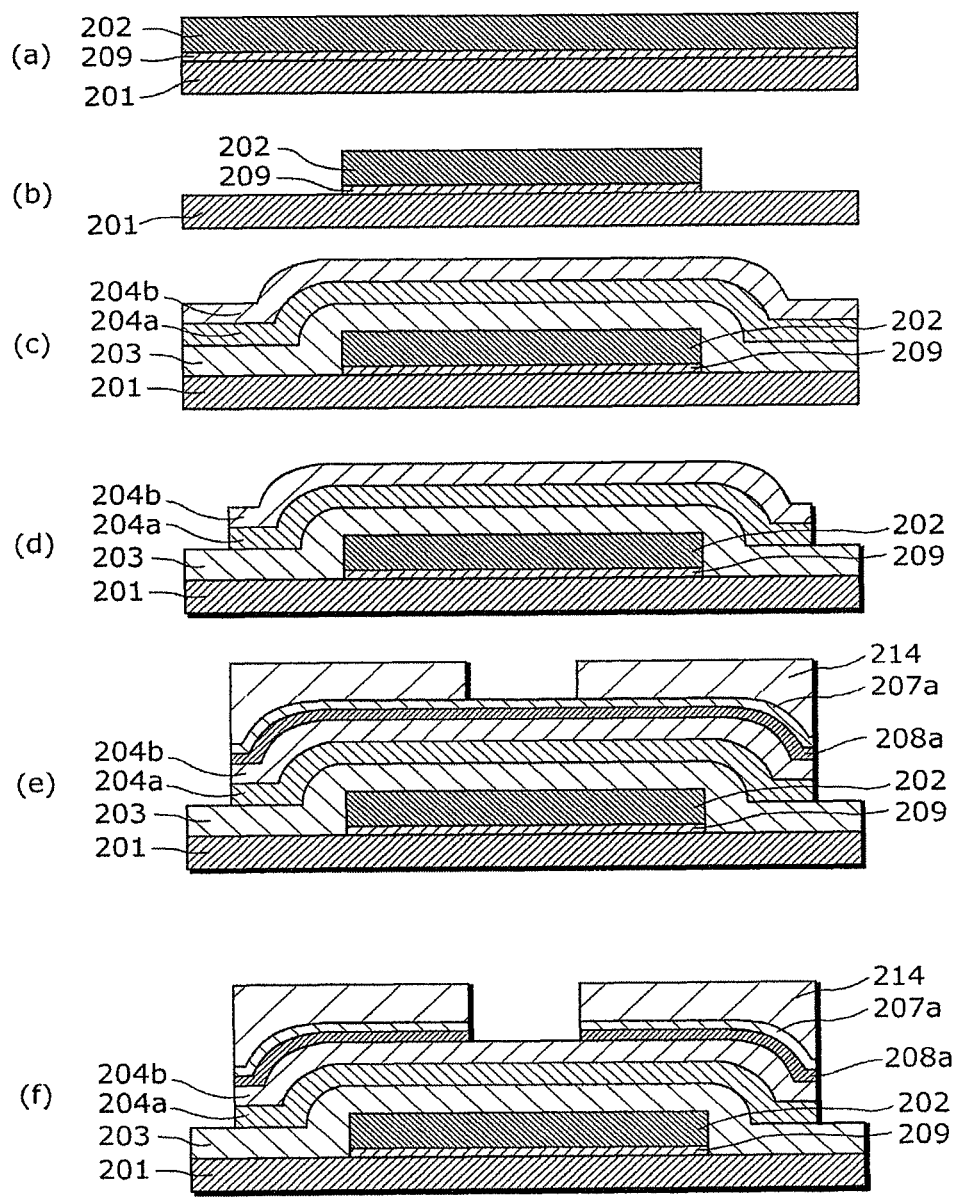
FIG. 2 (*a*) to (*f*) are cross-sectional views showing a manufacturing method in the first embodiment of the present invention.
Figure 3:
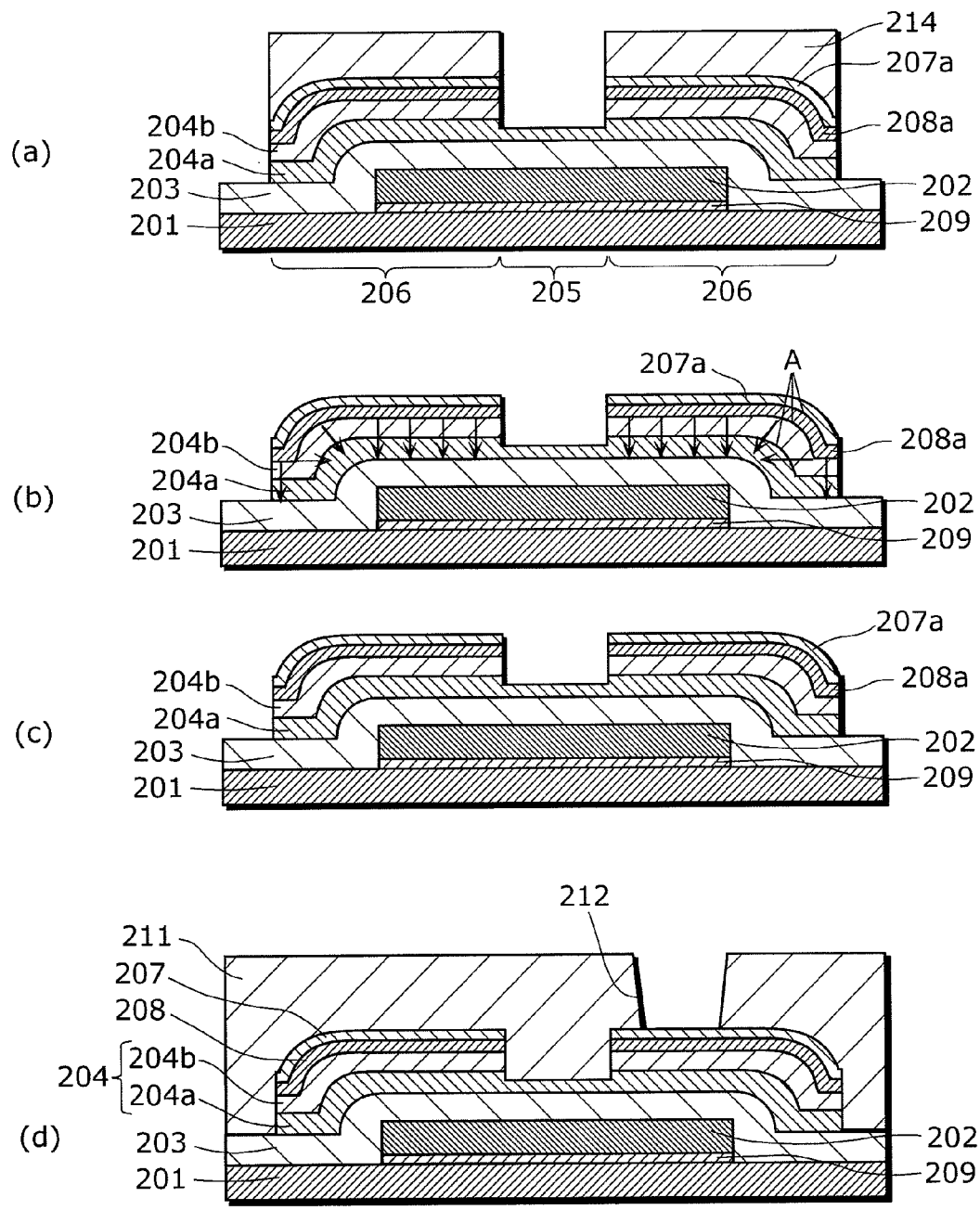
FIG. 3 (*a*) to (*d*) are cross-sectional views showing the manufacturing method in the first embodiment of the present invention.

It is to be noted that the same numerical references are given to components that are the same as those in the embodiment shown from FIG. 1 to FIG. 3, and their description shall be simplified.

Specifically, in the thin-film transistor shown in FIG. 4, an etching-protection layer 215 made of, for example a silicon nitride layer, is provided over the channel region 205 of the first semiconductor layer 204a.

Described more specifically, an etching-protection layer 215 made of, for example, a silicon nitride layer, is provided over the channel region 205 of the first semiconductor layer 204a, after which the second semiconductor layer 204b is provided.

The state in which the etching-protection layer 215 made of, for example, a silicon nitride layer, is provided over the channel region 205 of the first semiconductor layer 204a, and then the second semiconductor layer 204b is provided becomes a state such as that shown in FIG. 2(c).

Therefore, although the manufacturing proceeds through approximately the same processes as in FIG. 2(d) to FIG. 3 from here on, with the embodiment shown in FIG. 4, in the process corresponding to FIG. 3(a) in particular, etching does not reach up to the channel region 205 of the first semiconductor layer 204a as an effect of the etching-protection layer 215, and thus the thickness of the channel region 205 of the first semiconductor layer 204a becomes even.

Specifically, although an extremely large number of the thin-film transistor shown in FIG. 4 shall be aligned in the horizontal direction, when the thickness of the channel region 205 of the first semiconductor layer 204a is uneven between adjacent thin-film transistors, there are cases where the unevenness in terms of characteristics becomes a problem.

In such a case, by providing the etching-protection layer 215 over the channel region 205 of the first semiconductor layer 204a as in this embodiment, the thickness of the channel region 205 of the first semiconductor layer 204a becomes even for all the adjacent thin-film transistors, and thus the problem of unevenness in terms of characteristics can be solved.

Second Embodiment

Next, a second embodiment of the present invention shall be described with reference to the Drawings.

Figure 5:
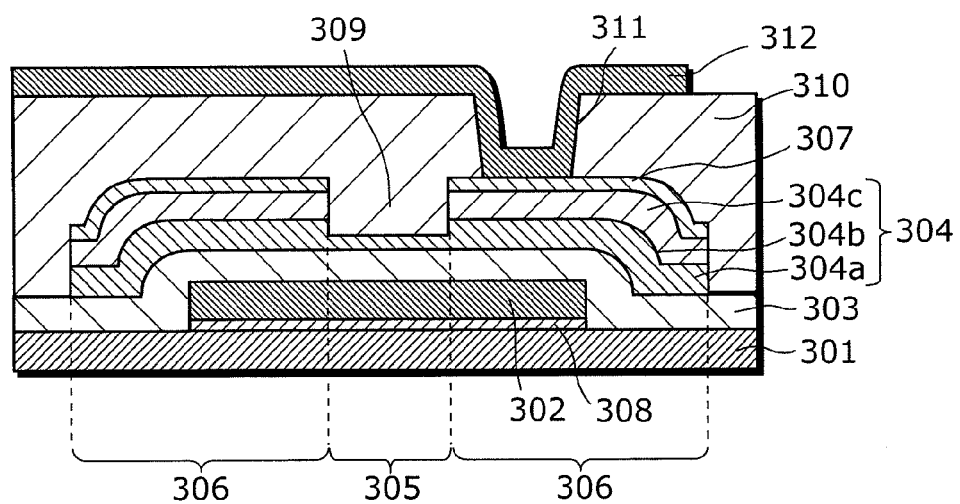
FIG. 5 is a cross-sectional view of a thin-film transistor in a second embodiment of the present invention.

FIG. 5 shows a thin-film transistor in an embodiment of the present invention. The thin-film transistor includes a substrate 301, a gate electrode 302 provided on the substrate 301, an insulation layer 303 covering the gate electrode 302, a semiconductor layer 304 provided on the insulation layer 303, source and drain electrodes (when one is a source electrode, the other is a drain electrode, and the same interpretation shall be maintained hereafter in this Description) 307 provided on source and drain regions (when one is a source region, the other is a drain region, and the same interpretation shall be maintained hereafter in this Description) 306 at respectively opposite sides with respect to a channel region 305 of the semiconductor layer 304.

Furthermore, the source and drain regions 306 of the semiconductor layer 304 are configured from a crystal layer 304a on the substrate 301-side, a silicide layer 304b of a crystallization-inducing metal provided on the crystal layer 304a, and a non-crystal layer 304c provided on the silicide layer 304b. The source and drain electrodes 307 are provided on the non-crystal layer 304c.

Describing the structure of the thin-film transistor in further detail, first, the substrate 301 is made from glass for example, and a silicon oxide layer 308 is provided on the substrate 301. The gate electrode 302 is formed on the silicon oxide layer 308 by, for example, sputtering of Mo.

Furthermore, the semiconductor layer 304 is configured of the crystal layer 304a on the lower surface-side, the silicide layer 304b of a crystallization-inducing metal formed on an upper part of the crystal layer 304a, and the non-crystal layer 304c provided on the silicide layer 304b.

Among these, the crystal layer 304a is made from non-doped amorphous silicon that is crystallized with a crystallization-inducing metal as a catalyst.

Furthermore, the non-crystal layer 304c is made from n-type or p-type amorphous silicon, and P-atoms and B-atoms, as dopants, are included as an n-type or p-type impurity.

Although described in detail in the manufacturing method to be described later, the silicide layer 304b of a crystallization-inducing metal is formed through the combining of a crystallization-inducing metal (which is at least one of Ni, Pd, Ti, Ag, Au, Al, Sn, Sb, Cu, Co, Cr, Mo, Tr, Ru, Rh, and Cd, although Ni is used as a representative in the present embodiment) and the silicon of the crystal layer 304a due to heating. It is to be noted that, as a crystallization-inducing metal, it is also possible to use at least one type of element selected from 8th group elements, 3B, 4B, and 5B elements.

Although the source and drain electrodes 307 are provided on the non-crystal layer 304c, the upper part of the crystal layer 304a, the entire part of the non-crystal layer 304c, and the entire part of the source and drain electrodes 307, which correspond to the channel region 305 of the semiconductor layer 304 are removed as shown in FIG. 5. With this, one of the source and drain electrodes 307 at the left and the right becomes a source electrode 307 and the other becomes a drain electrode 307.

Furthermore, with this removal, a recessed part 309 that reaches up to the upper part of the crystal layer 304a is formed in the channel region 305 of the semiconductor layer 304.

With the presence of this recessed part 309, the channel region 305 of the semiconductor layer 304 becomes a thinner layer compared to the source and drain regions 306.

In addition, a flattening layer 211 formed of a light-sensitive coating film is formed on the source and drain electrodes 307, and a part of a wire 311 is wired by passing through a through hole 311 in the flattening layer 310. With this, the source and drain electrodes 307 are connected to the wire 213.

Subsequently, the thin-film transistor in the present embodiment is connected to and drives, via the wire 312, the display elements arrayed in a matrix in the display device (an organic electroluminescence display device or a liquid crystal display device) of a television receiver for example.

Next, a method of manufacturing the thin-film transistor in the present embodiment shall be described.

First, the silicon oxide layer 308 and the gate electrode 302 are provided above the semiconductor substrate 301 as shown in FIG. 6(a), and then a patterning is performed by lithography, etching and the like as shown in FIG. 6(b).

Next, as shown in FIG. 6(c), the insulation layer 303 is provided so as to cover the gate electrode 302, and then a silicon layer for forming the crystal layer 304a is formed by plasma CVD, after which a crystallization-inducing metal layer 313 is formed by sputtering.

Subsequently, as shown in FIG. 6(d), the crystallization-inducing metal layer 313 within a range of a removal region 305a, which is wider than the channel region 305 of the crystal layer 304a, is removed by lithography, etching, and the like.

Next, the substrate 301 in the state in FIG. 6(d) is transported into an electric furnace.

In the electric furnace, the substrate 301 is gradually heated as it is transported, and the state in which the substrate 301 reaches 300° C. to 350° C. in the electric furnace at the start of the transportation is schematically shown in FIG. 6(e).

Specifically, as shown in FIG. 6(e), the Ni within the crystallization-inducing metal layer 313 start diffusional movement to the crystal layer 304a, and thus the silicide layer 304b is formed on the surface of the crystal layer 304a.

What is important here is that, as described above, the outer circumferences of the insulation layer 303, the crystal layer 304a, and the crystallization-inducing metal layer 313 are extended outside the outer circumference of the gate electrode 302.

Specifically, by extending the outer circumferences of the insulation layer 303, the crystal layer 304a, and the crystallization-inducing metal layer 313 outside the outer circumference of the gate electrode 302 in such manner, the outer circumference-parts of the insulation layer 303, the crystal layer 304a, and the crystallization-inducing metal layer 313 bend toward the substrate 301 as shown in FIG. 6(d). As a result, the curved planes A (or slanted planes) which face the channel region 305 of the semiconductor layer 304 are formed in the outer circumference-parts of the crystal layer 304a, and the crystallization-inducing metal layer 313.

Although there are aspects that have yet to be fully analyzed at present, as a conclusion, the forming of such curved planes A significantly contributes to the crystallization of the channel region 305 because, in the outer circumference-parts of the crystal layer 304a, and the crystallization-inducing metal layer 313, trajectories (slanted arrow or horizontal arrow) leading to the channel 505 of the semiconductor layer 304 are formed for the Ni moving to the crystal layer 304a from the crystallization-inducing metal layer 313 as shown in FIG. 6(e).

Specifically, in the silicon crystallization of crystal layer 304a, when heating reaches 500° C. or higher following the transportation of the substrate 301 within the electric furnace, the Ni acts as a catalyst for inducing crystallization, and thus crystallization progresses significantly.

In this case, since the crystallization-inducing metal layer 313 within a range of the removal region 305a that is wider than the channel region 305 of the crystal layer 304a is removed, the remainder of the crystallization-inducing metal layer 313 becomes distant from the channel region 305 of the crystal layer 304a, and thus making it difficult for the Ni to reach. However, in the present embodiment, as a conclusion, Ni also reaches the channel region 305 as shown in the schematic diagram in FIG. 6(f), thereby promoting crystallization, and enabling characteristics to be sufficiently demonstrated, although these are considered as being attributable to the forming of the curved planes A (or slanted planes), which face the channel region 305 of the semiconductor layer 404, in the outer circumference-parts of the crystal layer 304a and the crystallization-inducing metal layer 313 as previously described.

It is to be noted that the curved planes A (or slanted planes) which face the channel region 305 of the semiconductor layer 304 are formed, indicates a state in which the curved planes A (or slanted planes) face the channel region 305 of the semiconductor layer 304 in the case where the thin-film transistor in the present embodiment is cross-sectioned in the longitudinal direction as shown in FIG. 6(e).

Furthermore, the non-crystal layer 304c need not have such curved planes or slanted planes that face the channel region 305 of the semiconductor layer 304.

Furthermore, the reason for removing the crystallization-inducing metal layer 313 within a range of the removal region 305a that is wider than the channel region 305 of the crystal layer 304a is to prevent a large amount of Ni from progressing from directly above the channel region 305 and inhibiting the characteristics in the channel region 305.

Furthermore, making the removal region 305a wider than the channel region 305 of the crystal layer 304a also has the advantageous effect of being able to prevent a large amount of Ni from progressing from directly above the channel region 305 even when the mask of the removal region 305a is slightly displaced.

Next, as shown in FIG. 7(a), the non-crystal layer 304c including an n-type or p-type impurity is formed by plasma CVD, then the source and drain electrodes 307 are formed by sputtering.

Subsequently, as shown in FIG. 7(b), patterning of the source and drain electrodes 307, the non-crystal layer 304c, and the crystal layer 304a is performed by lithography or etching.

Next, as shown in FIG. 7(c), the source and drain electrodes 307, the entire part of non-crystal layer 304c, and the upper part of the crystal layer 304a, which correspond to the channel region 305 are removed by etching.

Specifically, in the present embodiment, the channel region 305 of the semiconductor layer 304 is formed into a recess, and accordingly, the channel region 305 of the semiconductor layer 304 becomes a thinner layer compared to the source and drain regions 206 as shown in FIG. 7(c).

In the substrate 301 configured in the above manner, the through-hole 311 can be easily formed by providing the flattening layer 310 made from a light-sensitive resin on the source and drain electrodes 307, and performing exposure and developing through lithography as shown in FIG. 7(d)

Then, following FIG. 7(d), the wire 312 is formed by forming a wire layer (not illustrated) by sputtering, and performing patterning by lithography or etching, and thus arriving at the completed state in FIG. 5.

Subsequently, the thin-film transistor in the present embodiment is connected to and drives, via the wire 312, the display elements arrayed in a matrix in the display device (an organic electroluminescence display device or a liquid crystal display device) of a television receiver for example.

In this case, since the silicide layer 304b of a crystallization-inducing metal is present in between the crystal layer 304a in the source and drain regions 306 of the semiconductor substrate 304 and the non-crystal layer 304c provided above the crystal layer 304a, the resistance value in such part can be reduced and, with this, thin-film transistor efficiency can also be improved.

Specifically, since metal atoms are included in the silicide layer 304b of a crystallization-inducing metal, carriers increase due to the free electrons of the metal atoms and, as a result, the resistance value becomes smaller and thus thin-film transistor efficiency can be improved.

Furthermore, as described previously, the thin-film transistor in the present embodiment, that is, the source and drain regions 306 of the semiconductor layer 304 are configured from a crystal layer 304a on the substrate 301-side, a silicide layer 304b of a crystallization-inducing metal provided on the crystal layer 304a, and a non-crystal layer 304c provided on the silicide layer 304b, and thus stable crystallization can take place in the source and drain regions 306 and the channel region 305 of the semiconductor layer 304 due to the crystallization-inducing metal layer.

Furthermore, since the non-crystal layer 304c including an n-type or p-type impurity is provided on the silicide layer 304b, the n-type or p-type impurity of the non-crystal layer 304c does not inadvertently intrude into the crystal layer 304a-side of the semiconductor layer 304, and as a result, transistor characteristics are stabilized.

Since a large number of the thin-film transistor in the present embodiment will be used, for example, in the display device of a television receiver, this also contributes significantly to the improvement of characteristics and efficiency of the electronic device as a whole.

Figure 8:
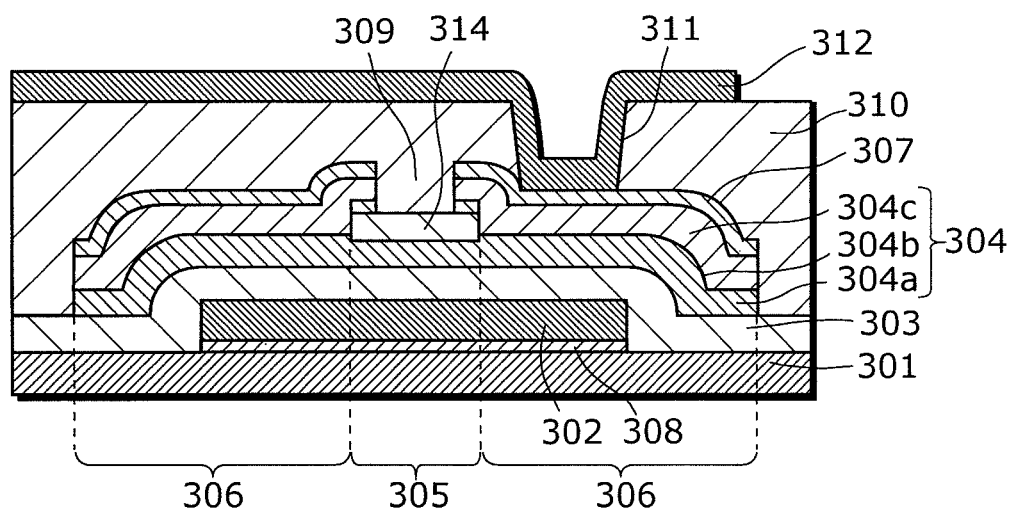
FIG. 8 is a cross-sectional view of a thin-film transistor in another embodiment (modification) of the present invention.

FIG. 8 shows another embodiment of the present invention, and the structure of a thin-film transistor thereof is as described below.

Figure 6:
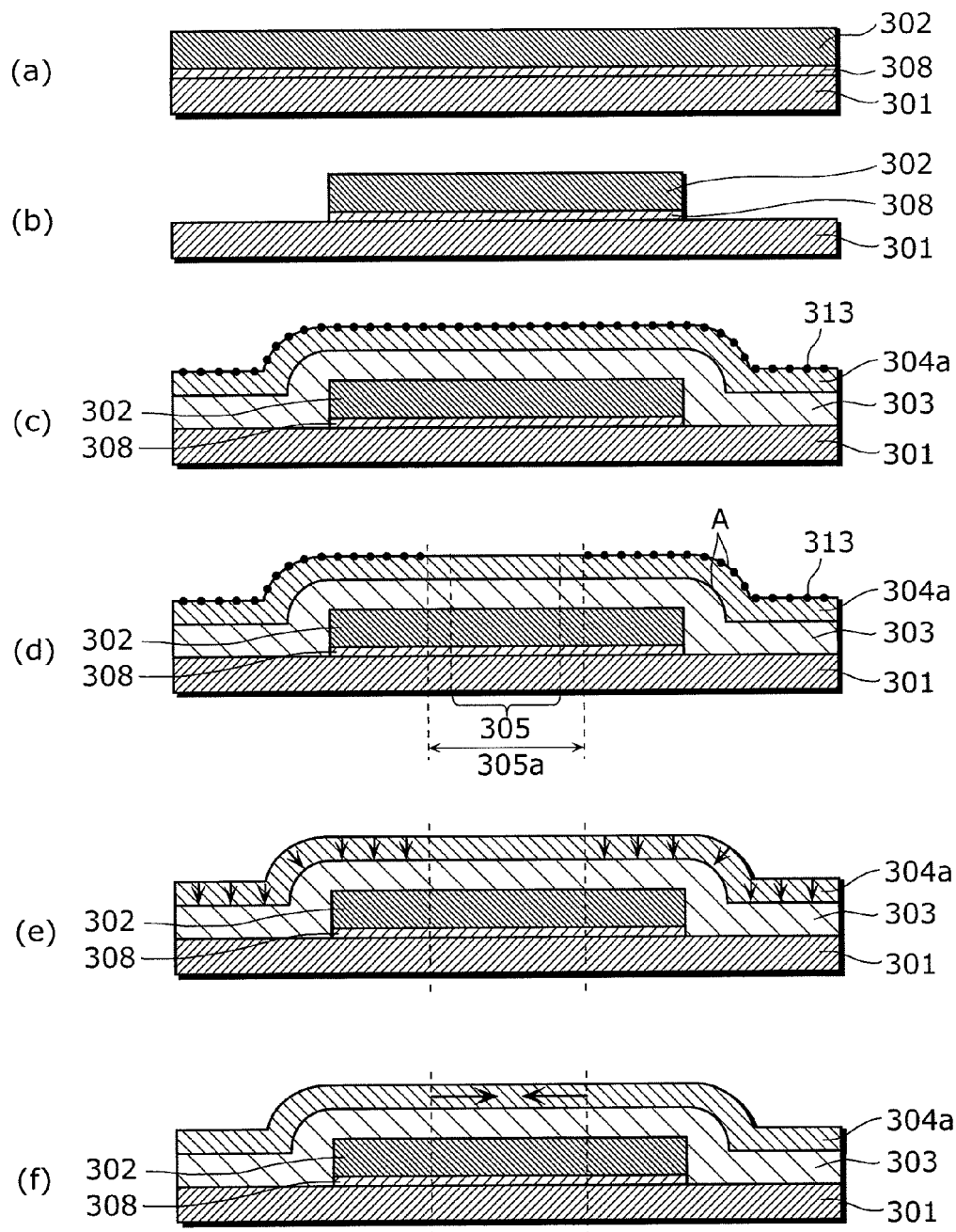
FIG. 6 (*a*) to (*f*) are cross-sectional views showing a manufacturing method in the second embodiment of the present invention.
Figure 7:
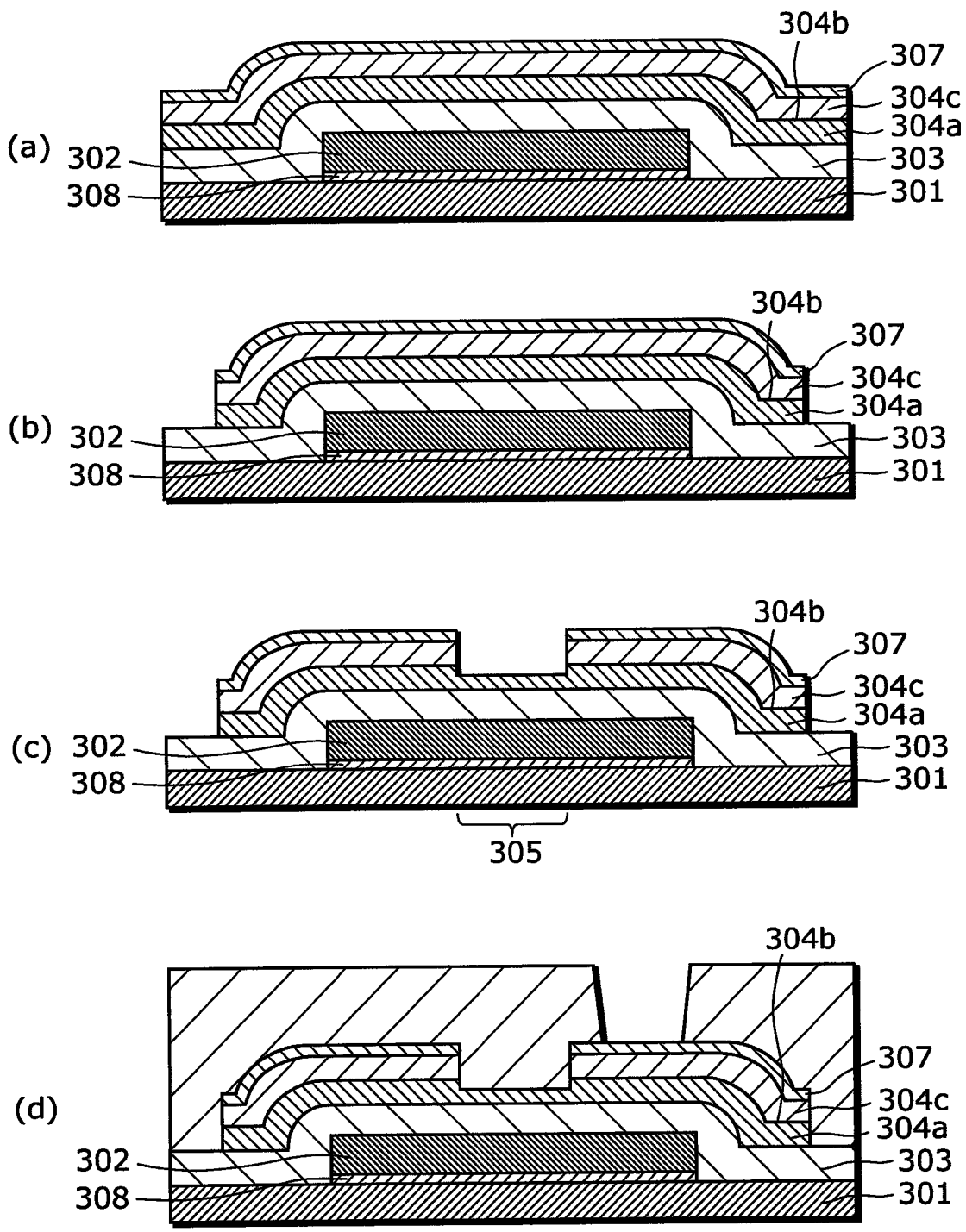
FIG. 7 (*a*) to (*d*) are cross-sectional views showing the manufacturing method in the second embodiment of the present invention.

It is to be noted that the same numerical references are given to components that are the same as those in the embodiment shown from FIG. 5 to FIG. 7, and their description shall be simplified.

Specifically, in the thin-film transistor shown in FIG. 8, an etching-protection layer 314 made of, for example a silicon nitride layer, is provided on the crystal layer 304a in the channel region 305.

Described more specifically, the etching-protection layer 314 made of, for example, a silicon nitride layer is provided over the crystal layer 304a in the channel region 305, after which the crystallization-inducing metal layer 313 is formed, by sputtering, on this etching-protection layer 314 and on the crystal layer 304a on both sides of this etching-protection layer 314 as shown in FIG. 6(c).

The state in which the etching-protection layer 314 made of, for example, a silicon nitride layer is provided over the crystal layer 304a in the channel region 305, and the crystallization-inducing metal layer 313 is further provided in this manner corresponds to the state shown in FIG. 6(c) as previously described.

Therefore, although the manufacturing proceeds through approximately the same processes as in FIG. 2(d) to FIG. 3 from here on, with the embodiment shown in FIG. 8, in the process corresponding to FIG. 7(c) in particular, etching does not reach up to the crystal layer 304a in the channel region 205 as an effect of the etching-protection layer 314, and thus the thickness of the crystal region 304a in the channel region 205 becomes even.

Specifically, although an extremely large number of the thin-film transistor shown in FIG. 8 shall be aligned in the horizontal direction, when the thickness of the crystal layer 304a in the channel region 205 is uneven between adjacent thin-film transistors, there are cases where the unevenness in terms of characteristics becomes a problem.

In such a case, by providing the etching-protection layer 314 on the crystal layer 304a in the channel region 205 as in this embodiment, the thickness of the crystal layer 304a in the channel region 205 becomes even for all the adjacent thin-film transistors, and thus the problem of unevenness in terms of characteristics can be solved.

Third Embodiment

Next, a third embodiment of the present invention shall be described.

Figure 9:
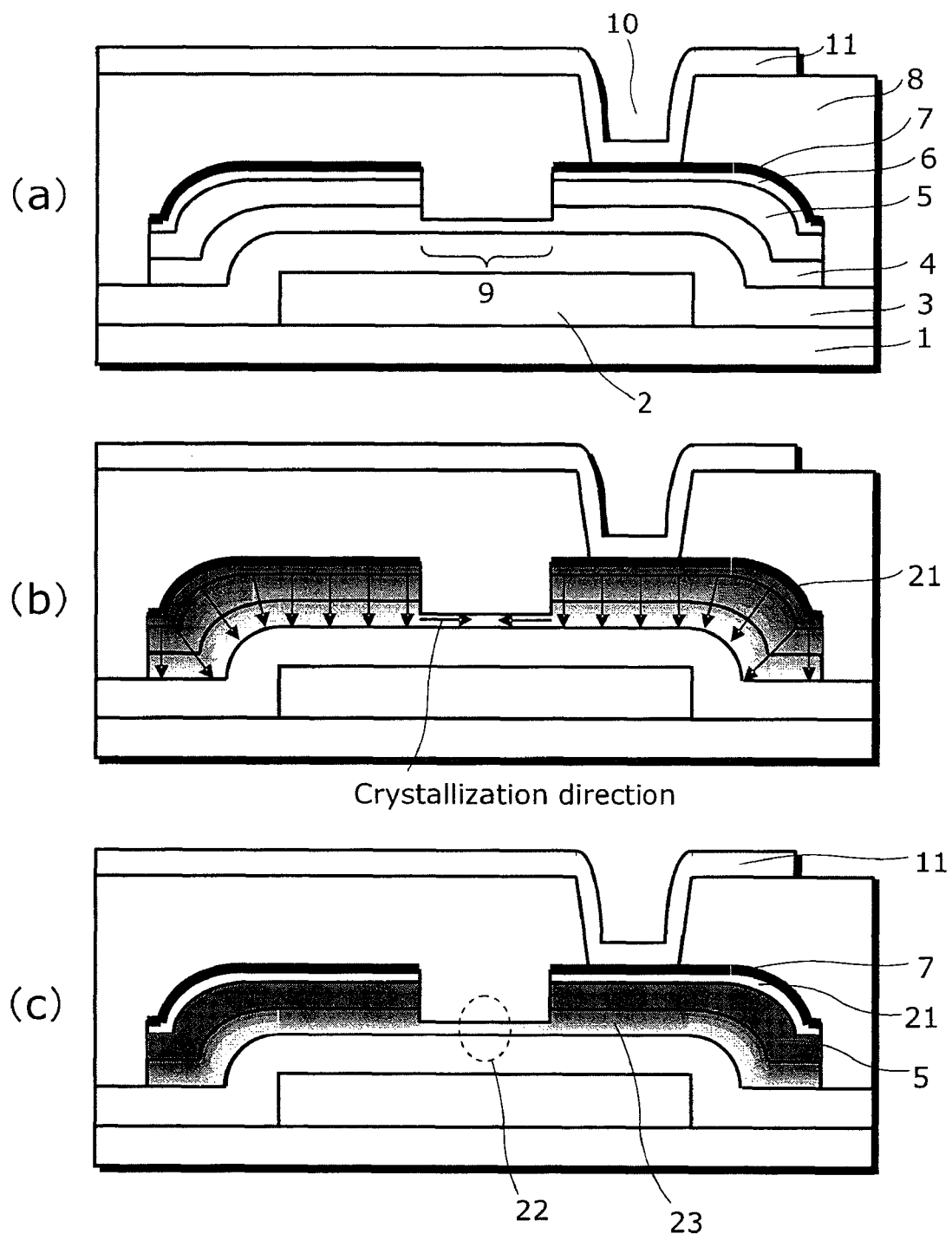
FIG. 9(a) is a cross-sectional view of a thin-film transistor, for describing a manufacturing method in a third embodiment.
FIG. 9(b) is a diagram showing the concentration distribution of Ni in Si layers of the thin-film transistor.
FIG. 9(c) is a diagram showing the concentration distribution of phosphor in the Si layers of the thin-film transistor.

FIG. 9(a) is a cross-sectional view of a thin-film transistor, for describing a manufacturing method in the present embodiment.

FIG. 9(b) is a diagram showing the concentration distribution of Ni in Si layers of the thin-film transistor.

FIG. 9(c) is a diagram showing the concentration distribution of phosphor in Si layers of the thin-film transistor.

Hereinafter, the method of manufacturing the thin-film transistor in the present embodiment shall be described using the Drawings.

First, a Mo layer is deposited on a glass substrate 1 by sputtering, and a gate electrode 2 is patterned. The gate electrode 2 may be of a laminated structure having a base film such as an oxide film between the Mo layer and the glass substrate 1.

Next, a silicon nitride film 3 which is a gate insulation film, an amorphous Si layer 4 which does not include impurities, and an n-type amorphous Si layer 5 which includes phosphor atoms as an impurity are deposited by, for example, plasma CVD. The amorphous Si layer 4 and the n-type amorphous Si layer 5 are patterned by lithography and etching in order to form an active (semiconductor) region of the thin-film transistor (TFT).

Next, a Ni layer 6 and a Mo layer 7 are deposited by sputtering, and the Ni layer and Mo layer on a channel region 9 of the TFT are selectively removed by lithography and etching so as to form a source electrode and a drain electrode.

In addition, the n-type amorphous Si layer 5 on the channel region 9 is removed by etching. At this time, the amorphous Si layer 4 is also etched to some extent.

Next, heat treatment is performed in a furnace at 500° C. or higher so as to cause the Ni in the Ni layer 6 to diffuse into the amorphous Si layer 4 and the n-type amorphous Si layer 5. At this time, although the Ni diffuses into the amorphous Si while acting as a catalyst for crystallization, part of the Ni remains without diffusing and thus forming a Ni silicide layer.

FIG. 9(b) shows the concentration distribution of Ni through shading, and indicates a decreasing Ni concentration as gray turns to white. Furthermore, arrows indicate the direction of Ni diffusion and amorphous Si crystallization. A Ni silicide layer 21 immediately under the Mo layer 7 has the highest concentration, and the concentration within the amorphous Si layers decreases as the distance from the silicide layer 21 increases. The amorphous Si layer 4 of the channel region 9 crystallizes through the diffusion of Ni from both sides thereof. With this, the mobility of the TFT can be improved. Here, Rapid Thermal Annealing (RTA) using lamps may be used for the heat treatment, in order to further control the thermal diffusion of Ni. When RTA is used, Ni thermal diffusion control is easy compared to heating using a furnace since the target temperature can be reached in a very short time, and thus it becomes possible to manufacture a TFT device having a small off-current.

Furthermore, the phosphor atoms within the n-type amorphous Si layer 5 are also thermally-diffused into the amorphous Si layer 4 by the heat treatment. FIG. 9(c) schematically shows the distribution of phosphor concentration, and indicates a decreasing phosphor concentration as gray turns to white. The phosphor concentration decreases as the distance from the n-type amorphous Si layer 5 increases, and thus concentration is lowest in the central part 22 of the channel region 9.

Lastly, a flattening film 8 is applied so as to flatten the surface. A through-hole 10 is formed in order to bring out the electrodes of the TFT formed earlier, and a draw wire 11 that is connected to the source electrode or the drain electrode is formed.

According to the present invention, since crystallization takes place after removing the n-type amorphous Si layer on the channel region, highly-concentrated phosphor atoms are not diffused into the channel region by the heat treatment, and thus excellent transistor characteristics can be obtained.

Furthermore, according to the present invention, there is low resistance between the active region and the source electrode and drain electrode since these are connected via the Ni silicide layer 21, and thus it is possible to manufacture a TFT device with minimal characteristic degradation due to resistance.

In addition, according to the present invention, since the Ni layer, which is used as a catalyst, is used as the source electrode and the drain electrode, there is no need to separately perform Ni layer pattern-forming for the crystallization of the Si layer of the channel region, and thus the manufacturing process can be simplified.

Fourth Embodiment

Next, a fourth embodiment of the present invention shall be described.

Figure 10:
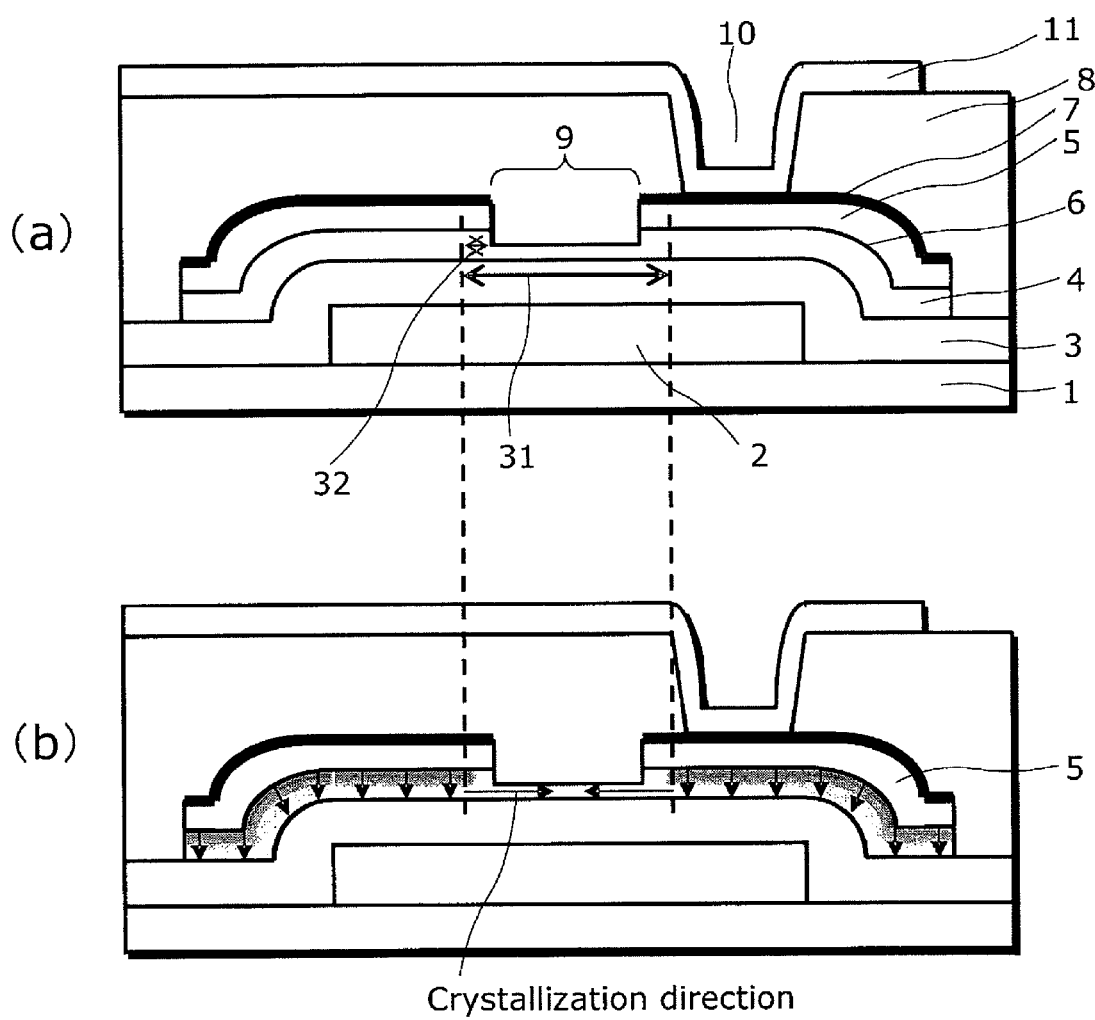
FIG. 10(a) is a cross-sectional view of a thin-film transistor, for describing a manufacturing method in a fourth embodiment.
FIG. 10(b) is a diagram showing the concentration distribution of Ni in Si layers of the thin-film transistor.

FIG. 10(a) is a cross-sectional view of a thin-film transistor, for describing a manufacturing method in the present embodiment.

FIG. 10(b) is a diagram showing the concentration distribution of Ni in Si layers of the thin-film transistor.

Hereinafter, the method of manufacturing the thin-film transistor in the present embodiment shall be described using the Drawings.

First, the Mo layer is deposited on the glass substrate 1 by sputtering, and the gate electrode 2 is patterned. The gate electrode 2 may be of a laminated structure having a base film such as an oxide film between the Mo layer and the glass substrate 1.

Next, the silicon nitride film 3 which is a gate insulation film, and the amorphous Si layer 4 which does not include impurities are deposited by, for example, plasma CVD, and a Ni layer is deposited by sputtering. Here, the thickness of the deposited Ni layer is extremely thin, with 10 nm or less being preferable. Next, taking into consideration displacement in the lithography process for forming the channel region to be described later, the Ni layer of a region 31 which is wider than the channel layer 9 is removed by lithography and etching.

Next, heat treatment is performed in a furnace at 500° C. or higher, and the amorphous Si layer 4 is crystallized using the Ni as a catalyst. Subsequently, unreacted Ni which has not reacted with Si is removed by etching using acid such as HCl.

Next, the n-type amorphous Si layer 5 which includes phosphor atoms as an impurity is deposited by plasma CVD, and the Mo layer 7 is deposited by sputtering. Subsequently, the amorphous Si layer 4, the n-type amorphous Si layer 5, and the Mo layer 7 are patterned by lithography and etching in order to form the active region of the TFT, and the n-type amorphous Si layer 5, and the Mo layer 7 on the channel region 9 are removed by lithography and etching. In the present embodiment, since there is no high-temperature heat treatment process after the depositing of the n-type amorphous Si layer 5, phosphor atoms do not diffuse into the amorphous Si layer 4 in the lower layer.

Lastly, a flattening film 8 is applied so as to flatten the surface. The through-hole 10 is formed in order to bring out the electrodes of the TFT formed earlier, and the draw wire 11 is formed.

FIG. 10(b) shows the concentration distribution of Ni, and indicates a decreasing Ni concentration as gray turns to white. Since crystallization heat treatment is introduced before the depositing of the n-type amorphous Si layer 5, the n-type amorphous Si layer 5 does not contain Ni and is also not crystallized. In the amorphous Si layer 4, the Ni concentration decreases as the distance from the n-type amorphous Si layer 5 increases.

Here, Rapid Thermal Annealing (RTA) using lamps may be used for the heat treatment, in order to further control the thermal diffusion of Ni. When RTA is used, Ni thermal diffusion control is easy compared to heating using a furnace since the target temperature can be reached in a very short time, and thus it becomes possible to manufacture a TFT device having a small off-current.

In addition, in the present invention, since the Ni removal region 31 on the channel region 9 is made wider than the channel region 9 to take into consideration displacement in the lithography process, Ni is not thermally-diffused up to the inside of the channel region, and thus there is an advantageous effect of further off-current characteristic improvement.

Furthermore, because the phosphor atoms within the n-type amorphous Si layer 5 are not diffused and remain within the film, excellent TFT characteristics can be attained.

Fifth Embodiment

Next, a fifth embodiment of the present invention shall be described.

The present embodiment is a modification of the third embodiment, and is different from the third embodiment in that an etch stopper film 12 is provided.

Figure 11:
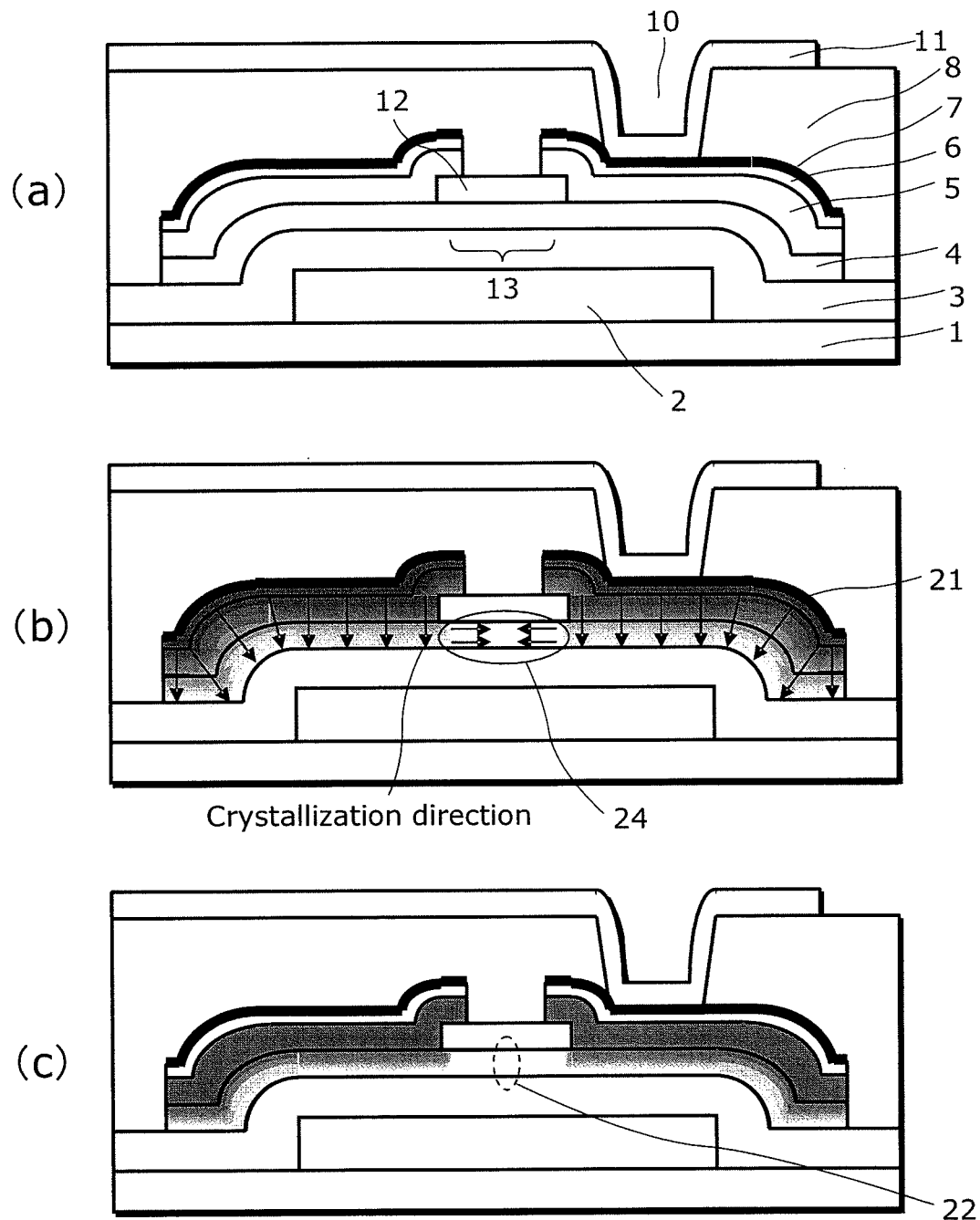
FIG. 11(a) is a cross-sectional view of a thin-film transistor, for describing a manufacturing method in a fifth embodiment.
FIG. 11(b) is a diagram showing the concentration distribution of Ni in Si layers of the thin-film transistor.
FIG. 11(c) is a diagram showing the concentration distribution of phosphor in the Si layers of the thin-film transistor.

FIG. 11(a) is a cross-sectional view of a thin-film transistor, for describing a manufacturing method in the present embodiment.

FIG. 11(b) is a diagram showing the concentration distribution of Ni in Si layers of the thin-film transistor.

FIG. 11(c) is a diagram showing the concentration distribution of phosphor in Si layers of the thin-film transistor.

Hereinafter, the method of manufacturing the thin-film transistor in the present embodiment shall be described using the Drawings.

First, the Mo layer is deposited on the glass substrate 1 by sputtering, and the gate electrode 2 is patterned. The gate electrode 2 may be of a laminated structure having a base film such as an oxide film between the Mo layer and the glass substrate 1.

Next, the silicon nitride film 3 which is a gate insulation film, the amorphous Si layer 4 which does not include impurities, and a silicon nitride film serving as an etch stopper film are successively deposited by, for example, plasma CVD. An etch stopper film 12 is patterned only on the channel region of the TFT by lithography and etching.

Next, the n-type amorphous Si layer 5 which includes phosphor atoms as an impurity is deposited by plasma CVD, and the Ni layer 6, and the Mo layer 7 are deposited by sputtering. The Ni layer and the Mo layer on a channel region 13 of the TFT are selectively removed by lithography and etching. Subsequently, etching is performed on the amorphous Si layer 4 and the n-type amorphous Si layer 5 using the same mask.

Next, heat treatment is performed in a furnace at 500° C. or higher so as to cause the Ni in the Ni layer 6 to diffuse into the amorphous Si layer 4 and the n-type amorphous Si layer 5. Although the Ni diffuses into the amorphous Si while acting as a catalyst for crystallization, part of the Ni remains without diffusing and thus forming a Ni silicide layer.

FIG. 11(b) shows the concentration distribution of Ni, and indicates a decreasing Ni concentration as gray turns to white. The Ni silicide layer 21 immediately under the Mo layer 7 has the highest concentration, and the concentration within the amorphous Si layers decreases as the distance from the silicide layer 21 increases. Here, Rapid Thermal Annealing (RTA) using lamps may be used for the heat treatment, in order to further control the thermal diffusion of Ni. When RTA is used, Ni thermal diffusion control is easy compared to heating using a furnace since the target temperature can be reached in a very short time, and thus it becomes possible to manufacture a TFT device having a small off-current.

Furthermore, the phosphor atoms within the n-type amorphous Si layer 5 are also thermally-diffused into the amorphous Si layer 4 by the heat treatment. FIG. 11(c) schematically shows the distribution of phosphor concentration, and indicates a decreasing phosphor concentration as gray turns to white. The phosphor concentration decreases as the distance from the n-type amorphous Si layer 5 increases, and thus concentration is lowest in the central part 22 of the channel region 13.

Lastly, the flattening film 8 is applied so as to flatten the surface. The through-hole 10 is formed in order to bring out the electrodes of the TFT formed earlier, and the draw wire 11 is formed.

According to the present invention, since crystallization takes place after removing the n-type amorphous Si layer on the channel region, highly-concentrated phosphor atoms are not diffused into the channel region by the heat treatment, and thus excellent transistor characteristics can be obtained.

In addition, due to the presence of the etch stopper film 12 on the channel region, a crystallized Si layer 24 of the channel region does not get scraped off by the etching of the n-type amorphous Si layer 5. As such, since unevenness in the thickness of the channel region Si layers does not occur among plural thin-film transistors, TFT characteristics having minimal unevenness can be attained.

Furthermore, according to the present invention, there is low resistance between the active region and the source electrode and drain electrode since these are connected via the Ni silicide layer 21, and thus it is possible to manufacture a TFT device with minimal characteristic degradation due to resistance.

Sixth Embodiment

Next, a sixth embodiment of the present invention shall be described.

The present embodiment is a modification of the fourth embodiment, and is different from the fourth embodiment in that the etch stopper film 12 is provided.

Figure 12:
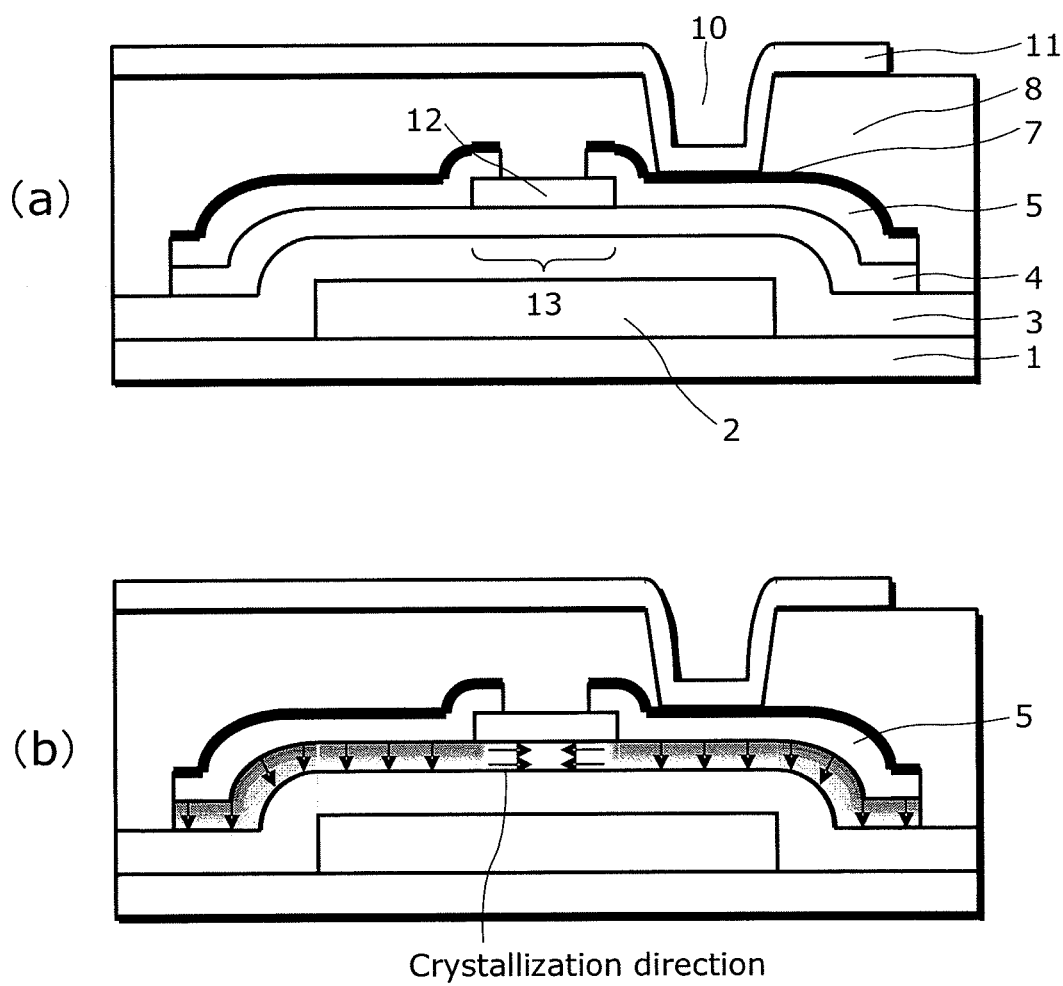
FIG. 12(a) is a cross-sectional view of a thin-film transistor, for describing a manufacturing method in a sixth embodiment.
FIG. 12(b) is a diagram showing the concentration distribution of Ni in Si layers of the thin-film transistor.

FIG. 12(a) is a cross-sectional view of a thin-film transistor, for describing a manufacturing method in the present embodiment.

FIG. 12(b) is a diagram showing the concentration distribution of Ni in Si layers of the thin-film transistor.

Hereinafter, the method of manufacturing the thin-film transistor in the present embodiment shall be described using the Drawings.

First, the Mo layer is deposited on a glass substrate 1 by sputtering, and the gate electrode 2 is patterned. The gate electrode 2 may be of a laminated structure having a base film such as an oxide film between the Mo layer and the glass substrate 1.

Next, the silicon nitride film 3 which is a gate insulation film, the amorphous Si layer 4 which does not include impurities, and a silicon nitride film serving as an etch stopper film are successively deposited by, for example, plasma CVD. The etch stopper film 12 is patterned only on the channel region of the TFT by lithography and etching.

Next, a Ni layer is deposited by sputtering. Here, the thickness of the deposited Ni layer is extremely thin, with 10 nm or less being preferable. Next, heat treatment is carried out in a furnace at 500° C. or higher, and the amorphous Si layer 4 is crystallized using the Ni as a catalyst. Subsequently, unreacted Ni which has not reacted with Si is removed by etching using acid such as HCl. Since Ni does not react with the silicon nitride film, only the Ni on the etch stopper film is selectively removed.

Next, the n-type amorphous Si layer 5 which includes phosphor atoms as an impurity is deposited by plasma CVD, and the Mo layer 7 is deposited by sputtering. Subsequently, the amorphous Si layer 4, the n-type amorphous Si layer 5, and the Mo layer 7 are patterned by lithography and etching in order to form the active region of the TFT, and the n-type amorphous Si layer 5, and the Mo layer 7 on the channel region 13 are removed by lithography and etching. In the present embodiment, since there is no high-temperature heat treatment process after the depositing of the n-type amorphous Si layer 5, phosphor atoms do not diffuse into the amorphous Si layer 4 in the lower layer.

Lastly, the flattening film 8 is applied so as to flatten the surface. The through-hole 10 is formed in order to bring out the electrodes of the TFT formed earlier, and the draw wire 11 is formed.

FIG. 12(b) shows the concentration distribution of Ni, and indicates a decreasing Ni concentration as gray turns to white. Since crystallization heat treatment is introduced before the depositing of the n-type amorphous Si layer 5, the n-type amorphous Si layer 5 does not contain Ni and is also not crystallized. In the amorphous Si layer, the Ni concentration decreases as the distance from the n-type amorphous Si layer 5 increases.

Here, Rapid Thermal Annealing (RTA) using lamps may be used for the heat treatment, in order to further control the thermal diffusion of Ni. When RTA is used, Ni thermal diffusion control is easy compared to is heating using a furnace since the target temperature can be reached in a very short time, and thus it becomes possible to manufacture a TFT device having a small off-current.

Furthermore, because the phosphor atoms within the n-type amorphous Si layer 5 are not diffused and remain within the film, excellent TFT characteristics can be attained.

Seventh Embodiment

Next, a seventh embodiment of the present invention shall be described.

The present embodiment shows a top gate thin-film transistor.

Figure 13:
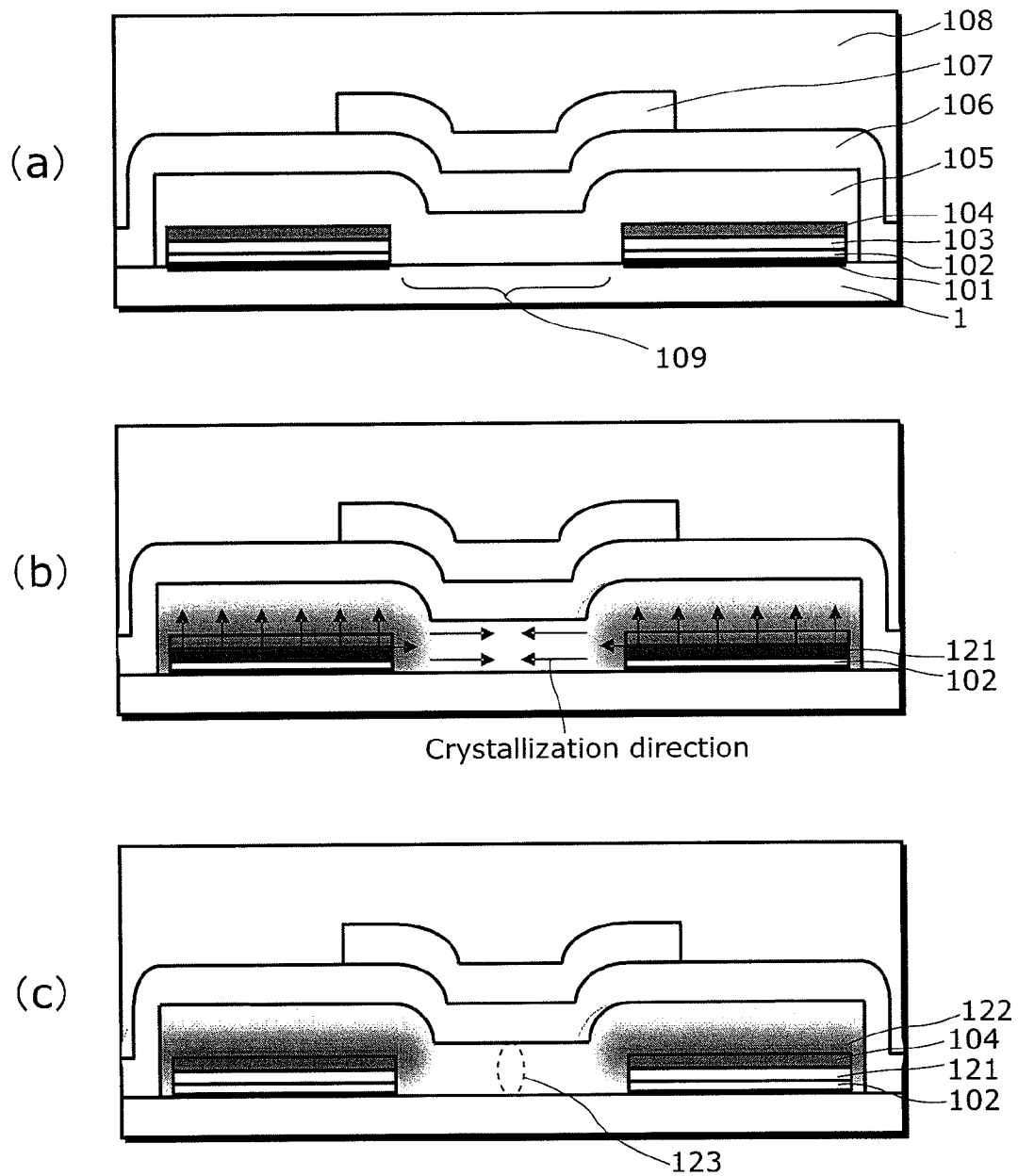
FIG. 13(a) is a cross-sectional view of a thin-film transistor, for describing a manufacturing method in a seventh embodiment.
FIG. 13(b) is a diagram showing the concentration distribution of Ni in Si layers of the thin-film transistor.
FIG. 13(c) is a diagram showing the concentration distribution of phosphor in the Si layers of the thin-film transistor.

FIG. 13(a) is a cross-sectional view of a thin-film transistor, for describing a manufacturing method in the present embodiment.

FIG. 13(b) is a diagram showing the concentration distribution of Ni in Si layers of the thin-film transistor.

FIG. 13(c) is a diagram showing the concentration distribution of phosphor in Si layers of the thin-film transistor.

Hereinafter, the method of manufacturing the thin-film transistor in the present embodiment shall be described using the Drawings.

First, an oxide film 101, a Mo layer 102, a Ni layer 103, and an n-type amorphous Si layer 104 including phosphor atoms as an impurity, are successively deposited above the glass substrate 1. Next, a source electrode and a drain electrode of the TFT are patterned by lithography and etching.

Next, an amorphous Si layer 105 which does not include impurities is deposited, and patterning is performed so as to leave the amorphous Si layer 105 on the active region of the TFT including the source electrode and the drain electrode. Next, after depositing a silicon nitride film 106, heat treatment is performed in a furnace at 500° C. or higher, and the n-type amorphous Si layer 104 and the amorphous Si layer 105 are crystallized using Ni as a catalyst. Although, as a catalyst, the Ni of the Ni layer 103 diffuses into the amorphous Si layers, part of the Ni remains without diffusing, and thus forming a Ni silicide layer.

Next, a Mo layer is deposited by sputtering, and a gate electrode 107 is pattern-formed so as to cover a channel region 109 between the source electrode and the drain electrode.

Lastly, a flattening film 108 is applied so as to flatten the surface. Although not illustrated in the diagram, a through hole is opened over the gate electrode, as necessary, in order to bring out the gate electrode of the TFT and a drawing wire is formed.

FIG. 13(b) shows the concentration distribution of Ni, and indicates a decreasing Ni concentration as gray turns to white. A Ni silicide layer 121 immediately above the Mo layer 102 has the highest concentration, and the concentration within the amorphous Si layers decreases as the distance from the silicide layer 121 increases. Furthermore, since the cross-section area of the Ni layer 103 is small, the number of Ni atoms diffusing in the horizontal direction is decidedly less compared to the number of Ni atoms diffusing in the vertical direction, and thus the Ni included in the channel region 109 can be kept to a minimum. As such, it is possible to manufacture a TFT device having a small off-current.

Here, Rapid Thermal Annealing (RTA) using lamps may be used for the heat treatment, in order to further control the thermal diffusion of Ni. When RTA is used, Ni thermal diffusion control is easy since the target temperature can be reached in a very short time, and thus it becomes possible to manufacture a TFT device having smaller off-current.

Furthermore, the phosphor atoms within the n-type amorphous Si layer 104 are also thermally-diffused into the amorphous Si layer 105 by the heat treatment. FIG. 13(c) schematically shows the distribution of phosphor concentration, and indicates a decreasing phosphor concentration as gray turns to white. The phosphor concentration decreases as the distance from the n-type amorphous Si layer 104 increases, and thus concentration is lowest in a central part 123 of the channel region 109, and the influence on the TFT characteristics can be lessened.

Furthermore, according to the present structure, there is low resistance between the channel region and the source electrode and drain electrode since these are connected via the Ni silicide layer 121, and thus it is possible to manufacture a TFT device with minimal characteristic degradation due to resistance.

INDUSTRIAL APPLICABILITY

As described thus far, the present invention is capable of improving productivity for thin-film transistors, and is capable of improving efficiency as a thin-film transistor.

Therefore, the present invention can contribute to cost reduction and improved efficiency of various electronic devices using the thin-film transistor according to the present invention. For example, a thin-film transistor resulting from a manufacturing method in an implementation of the present invention is useful as a switching element used in display devices such as organic EL displays or liquid crystal displays.

The invention claimed is:

1. A method of manufacturing a thin-film transistor, said method comprising:

forming a gate electrode on a substrate, forming an insulation layer so as to cover the gate electrode, forming a semiconductor layer on the insulation layer, and forming a crystallization-inducing metal layer on the semiconductor layer;

removing at least a part of the crystallization-inducing metal layer, the part being over a channel region of the semiconductor layer;

forming source and drain electrodes at positions on the crystallization-inducing metal layer which are over source and drain regions respectively, the source and drain regions being located at respectively opposite sides with respect to the channel region of the semiconductor layer; and heating the crystallization-inducing metal layer to form a silicide layer of a crystallization-inducing metal, wherein, in said forming of an insulation layer, a semiconductor layer, and a crystallization-inducing metal layer, outer circumferences of the insulation layer, the semiconductor layer, and the crystallization-inducing metal layer are not located inwards of an outer circumference of the gate electrode and are formed to extend outside the outer circumference of the gate electrode, so as to form curved planes or slanted planes, each of which faces the channel region of the semiconductor layer, in the semiconductor layer and the crystallization-inducing metal layer outside the outer circumference of the gate electrode, and in said heating, the crystallization-inducing metal layer is heated in a state in which the curved planes or the slanted planes are formed in the semiconductor layer and the crystallization-inducing metal layer.

2. The method of manufacturing a thin-film transistor according to claim 1, further comprising forming an electrode layer on the crystallization-inducing metal layer, before the removal in said removing, wherein in said removing, a part of the electrode layer, a part of the crystallization-inducing metal layer, and a part of the semiconductor layer are removed, the part of the electrode layer and the part of the crystallization-inducing metal layer being located over the channel region of the semiconductor layer, and the part of the semiconductor layer being located in the channel region, the source and drain electrodes are formed as a result of the removal in said removing, and in said heating, the crystallization-inducing metal layer is heated after the source and drain electrodes are formed in said forming of source and drain electrodes.

3. The method of manufacturing a thin-film transistor according to claim 2,
wherein in said forming of a semiconductor layer, the semiconductor layer is formed using silicon as a main material, and
in said forming of a crystallization-inducing metal layer, the crystallization-inducing metal layer is formed using, as a main material, at least one of Ni, Pd, Ti, Ag, Au, Al, Sn, Sb, Cu, Co, Cr, Mo, Tr, Ru, Rh, and Cd.

4. The method of manufacturing a thin-film transistor according to claim 2,
wherein in said forming of a semiconductor layer, a first semiconductor layer is formed on the insulation layer, an etching-protection layer is formed on a channel region of the first semiconductor layer, and a second semiconductor layer is formed above the first semiconductor layer so as to cover the etching-protection layer, and
in said removing, the second semiconductor layer is removed as the part of the semiconductor layer.

5. The method of manufacturing a thin-film transistor according to claim 4,
wherein, in said forming of an insulation layer, a first semiconductor layer and a second semiconductor layer, and a crystallization-inducing metal layer, outer circumferences of the insulation layer, the first semiconductor and the second semiconductor layer, and the crystallization-inducing metal layer are formed to extend outside an outer circumference of the gate electrode, so as to form curved planes or slanted planes, each of which faces the channel region of the semiconductor layer, in the semiconductor layer and the crystallization-inducing metal layer outside the outer circumference of the gate electrode.

6. The method of manufacturing a thin-film transistor according to claim 4,
wherein in said forming of a first semiconductor layer, the semiconductor layer is formed using silicon as a main material,
in said forming of a second semiconductor layer, the second semiconductor layer is formed using, as a main material, silicon into which an n-type or p-type impurity is included, and
in said forming of a crystallization-inducing metal layer, the crystallization-inducing metal layer is formed using, as a main material, at least one of Ni, Pd, Ti, Ag, Au, Al, Sn, Sb, Cu, Co, Cr, Mo, Tr, Ru, Rh, and Cd.

7. The method of manufacturing a thin-film transistor according to claim 1,
wherein in said heating, the source and drain regions of the semiconductor layer are changed into a crystal layer and the silicide layer of the crystallization-inducing metal is formed on the crystal layer, by heating the semiconductor layer and the crystallization-inducing metal layer after the removal in said removing, and
in said forming of source and drain electrodes, a non-crystal layer of the semiconductor layer is further formed on the silicide layer of the crystallization-inducing metal after the heating in said heating, and the source and drain electrodes are formed after an electrode layer is formed on the non-crystal layer of the semiconductor layer, the non-crystal layer containing an n-type or p-type impurity.

8. The method of manufacturing a thin-film transistor according to claim 7,
wherein in said forming of a crystal layer of the semiconductor layer, the crystal layer is formed using silicon as a main material, and
in said forming of a crystallization-inducing metal layer, the crystallization-inducing metal layer is formed using, as a main material, at least one of Ni, Pd, Ti, Ag, Au, Al, Sn, Sb, Cu, Co, Cr, Mo, Tr, Ru, Rh, and Cd.

9. The method of manufacturing a thin-film transistor according to claim 7,
wherein in said forming of a gate electrode, an insulation layer, a semiconductor layer, and a crystallization-inducing metal layer, an etching-protection layer is formed over the channel region of the semiconductor layer, and the crystallization-inducing metal layer is formed on the etching-protection layer and on the semiconductor layer at both sides of the etching-protection layer.

10. The method of manufacturing a thin-film transistor according to claim 9,
wherein in said forming of a crystal layer of the semiconductor layer, the crystal layer is formed using silicon as a main material,
in said forming of a non-crystal layer of the semiconductor layer, the non-crystal layer is formed using, as a main material, silicon into which an n-type or p-type impurity is included, and
in said forming of a crystallization-inducing metal layer, the crystallization-inducing metal layer is formed using, as a main material, at least one of Ni, Pd, Ti, Ag, Au, Al, Sn, Sb, Cu, Co, Cr, Mo, Tr, Ru, Rh, and Cd.

11. A thin-film transistor comprising:
a substrate;
a gate electrode formed on said substrate;
an insulation layer covering said gate electrode;
a semiconductor layer formed on said insulation layer; and
source and drain electrodes respectively formed over source and drain regions which are located at respectively opposite sides with respect to a channel region of the semiconductor layer,
wherein a silicide layer of a crystallization-inducing metal is formed between the source and drain regions of said semiconductor layer and said source and drain electrodes which are formed above the source and drain regions, and outer circumferences of said insulation layer, said semiconductor layer, and said silicide layer are not located inwards of an outer circumference of the gate electrode and are formed to extend outside the outer circumference of said gate electrode, so as to form curved planes or slanted planes, each of which faces the channel region of the semiconductor layer, in said semiconductor layer and said silicide layer outside the outer circumference of said gate electrode.

12. The thin-film transistor according to claim 11,
wherein said semiconductor layer is formed using silicon as a main material, and
said silicide layer is formed of an alloy of silicon and the crystallization-inducing metal which is at least one of Ni, Pd, Ti, Ag, Au, Al, Sn, Sb, Cu, Co, Cr, Mo, Tr, Ru, Rh, and Cd.

13. The thin-film transistor according to claim 11,
wherein the channel region of said semiconductor layer is thinner compared to the source and drain regions of said semiconductor layer.

14. The thin-film transistor according to claim 13,
wherein the channel region of said semiconductor layer is formed by forming a recess in a portion of said semiconductor layer that corresponds to the channel region.

15. The thin-film transistor according to claim 14,
wherein an etching-protection layer is formed over the channel region of the semiconductor substrate.

16. The thin-film transistor according to claim 11,
wherein the source and drain regions of said semiconductor layer include a crystal layer at a substrate-side, a silicide layer of a crystallization-inducing metal formed on said crystal layer, and a non-crystal layer formed on said silicide layer, said non-crystal layer contains an n-type or p-type impurity, and said source and drain electrodes are formed on said non-crystal layer.

17. The thin-film transistor according to claim 16,
wherein said crystal layer of said semiconductor layer is formed using silicon as a main material, and said silicide layer is formed of an alloy of silicon and the crystallization-inducing metal which is at least one of Ni, Pd, Ti, Ag, Au, Al, Sn, Sb, Cu, Co, Cr, Mo, Tr, Ru, Rh, and Cd.

18. The thin-film transistor according to claim 16,
wherein the channel region of said semiconductor layer is thinner compared to the source and drain regions of said semiconductor layer.

19. The thin-film transistor according to claim 18,
wherein the channel region of said semiconductor layer is formed by forming a recess in a portion of said semiconductor layer that corresponds to the channel region.

20. The thin-film transistor according to claim 19,
wherein an etching-protection layer is formed over the channel region of the semiconductor substrate.

21. An electronic device comprising:
display elements arrayed in a matrix; and
a driving circuit which drives said display elements, and includes the thin-film transistor according to claim 11.

* * * * *